United States Patent [19]

Shapiro

[11] Patent Number: 4,578,767

[45] Date of Patent: Mar. 25, 1986

[54] X-RAY SYSTEM TESTER

[75] Inventor: Jonathan S. Shapiro, Cos Cob, Conn.

[73] Assignee: Raytheon Company, Lexington, Mass.

[21] Appl. No.: 307,811

[22] Filed: Oct. 2, 1981

[51] Int. Cl.[4] .................. G06F 15/20; H05G 1/26
[52] U.S. Cl. ................................ 364/550; 364/414; 378/109; 378/110; 378/111; 378/112; 378/207
[58] Field of Search ............... 364/413, 414, 415, 550, 364/551, 579; 378/109, 110, 111, 112, 207

[56] References Cited

U.S. PATENT DOCUMENTS

| | | | |
|---|---|---|---|
| 3,576,494 | 4/1971 | Bahis et al. | 324/73 R |
| 3,878,373 | 4/1975 | Blum | 364/414 |
| 3,906,437 | 9/1975 | Brandwein et al. | 340/945 |
| 4,004,576 | 1/1977 | Gähwiler et al. | 364/413 |
| 4,068,306 | 1/1978 | Chen et al. | 364/414 |
| 4,071,760 | 1/1978 | LeMay | 378/4 |
| 4,097,793 | 6/1978 | Shapiro et al. | 324/403 |
| 4,121,294 | 10/1978 | Galanis et al. | 364/571 |
| 4,155,116 | 5/1979 | Tawfik et al. | 364/579 |
| 4,160,906 | 7/1979 | Daniels et al. | 364/414 |
| 4,181,939 | 1/1980 | Lyons | 364/200 |
| 4,189,645 | 2/1980 | Chaney et al. | 378/207 |
| 4,203,033 | 5/1980 | Jacobson | 250/252.1 |
| 4,217,641 | 8/1980 | Naparstek | 364/414 |
| 4,228,505 | 10/1980 | Wagner | 364/414 |
| 4,236,079 | 11/1980 | Sandland | 378/19 |
| 4,258,421 | 3/1981 | Juhasz et al. | 364/424 |
| 4,377,748 | 3/1983 | Aichinger et al. | 378/110 |

FOREIGN PATENT DOCUMENTS

| | | |
|---|---|---|
| 1465867 | 7/1967 | United Kingdom . |
| 1308872 | 7/1971 | United Kingdom . |
| 1380181 | 2/1972 | United Kingdom . |
| 1592405 | 9/1977 | United Kingdom . |
| 1591680 | 1/1978 | United Kingdom . |
| 2031625 | 7/1979 | United Kingdom . |

Primary Examiner—Parshotam S. Lall
Assistant Examiner—Edward R. Cosimano
Attorney, Agent, or Firm—Denis G. Maloney; Richard M. Sharkansky

[57] ABSTRACT

An X-ray system tester for measuring a set of electrical signals comprising anode voltage, cathode voltage, anode current, filament current and line voltage produced by an X-ray system during the operation of such system. A selector is provided, which couples one of the electrical signals of the sets thereof produced or one of a plurality of processing control signals entered by an operator from a control panel, to a digitizing section, selectively in accordance with control signals provided to the selector by a computing section. The digitizing section converts the selected signal whether produced by the X-ray system or entered from the control panel, into a train of pulses having a frequency proportional to the value of the selected signal. The pulses in the pulse train are counted by a counter. The number of counts being used by the computing section to determine the frequency, and hence, the value of the selected signal. This computed value is stored in a computing memory section and the computing section which there selects a different one of the electrical signals for processing. The computing section is also adapted to store a plurality of the sets of electrical signals produced during a corresponding sequence of operational intervals of the X-ray system and determines a measure of the deviation of any selected one of the stored electrical signals over the sequence of operating intervals. The operator of the tester is able to recall from storage each one of the electrical signals produced during the sequential operational intervals to aid the operator in analyzing the operation of the X-ray system.

14 Claims, 24 Drawing Figures

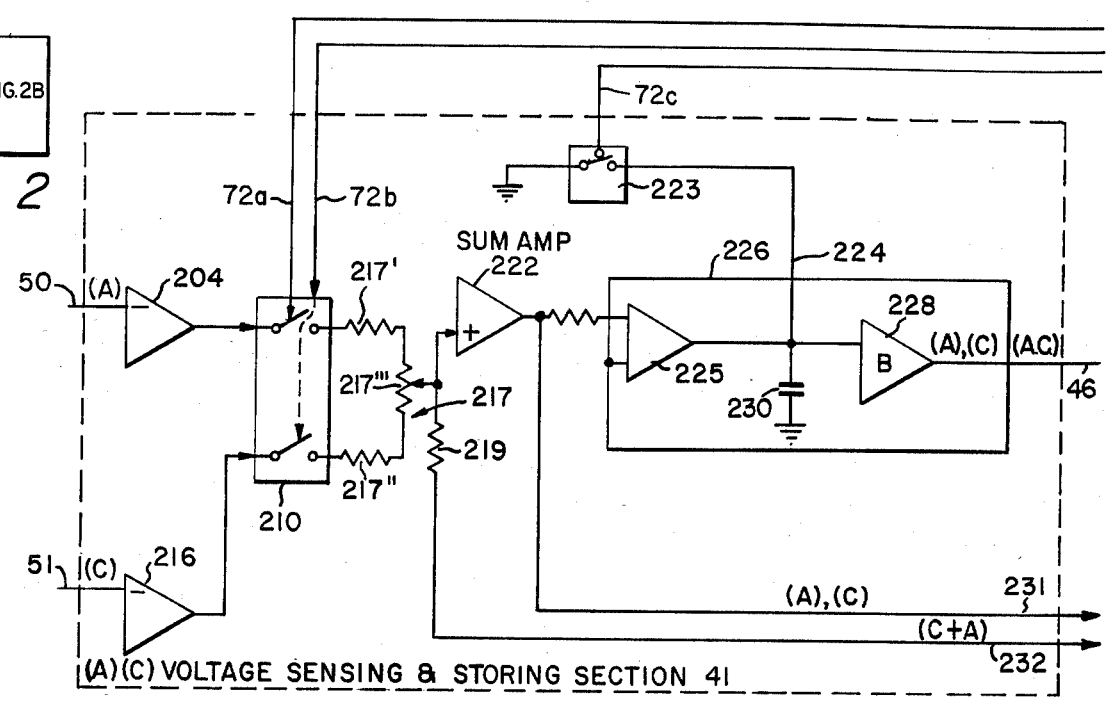
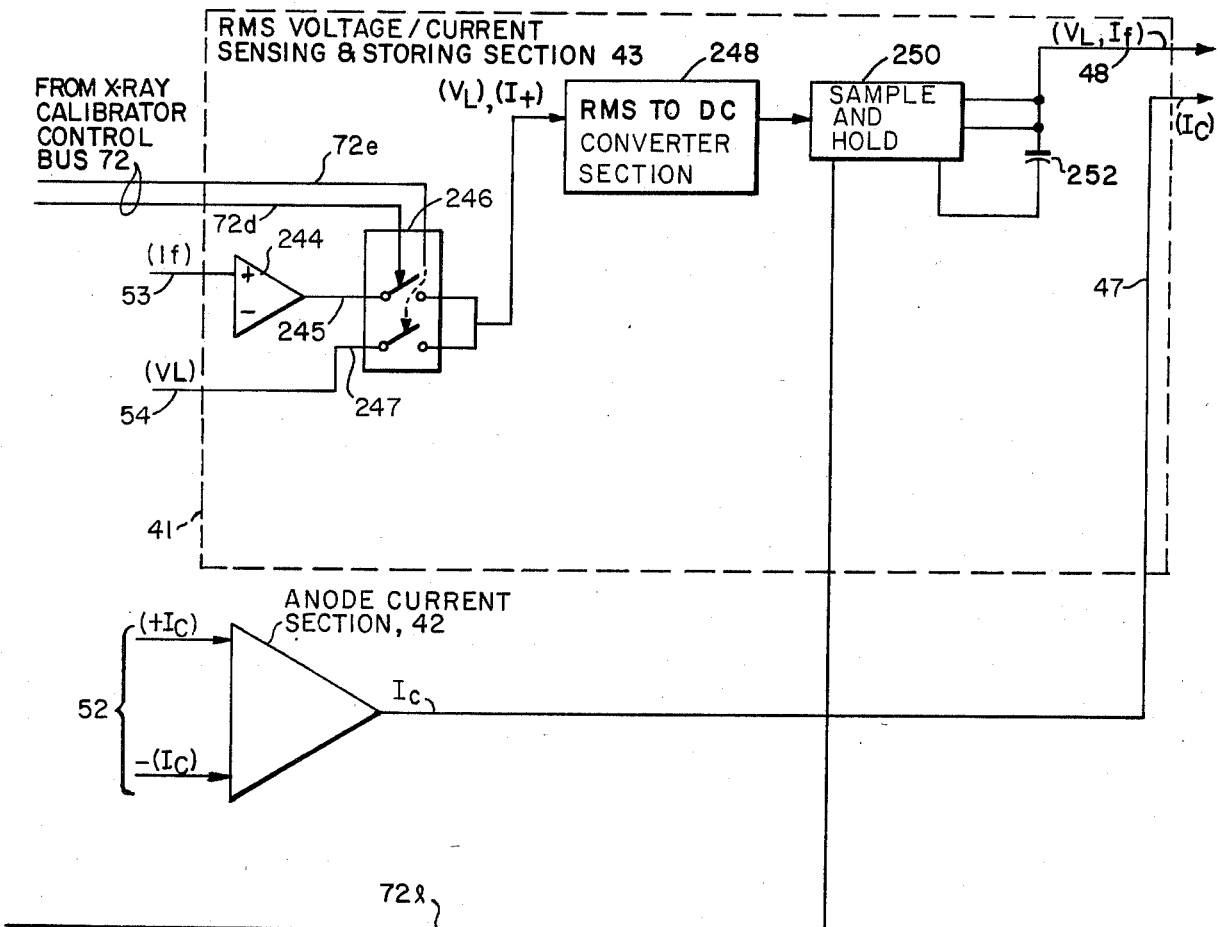
FIG. 2
FIG. 2A

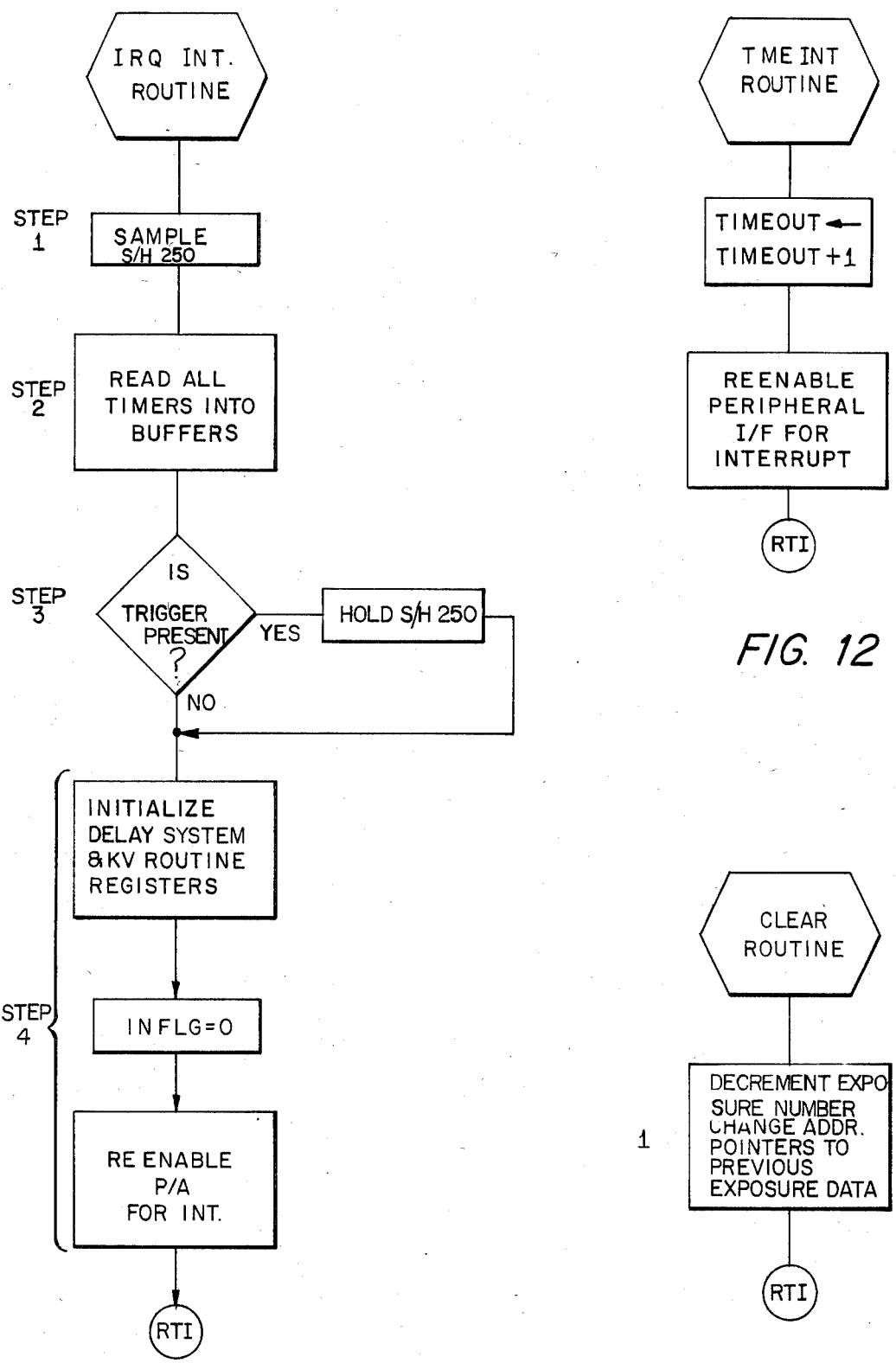
FIG. 11
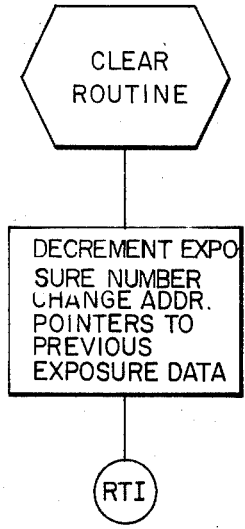
FIG. 12
FIG. 13

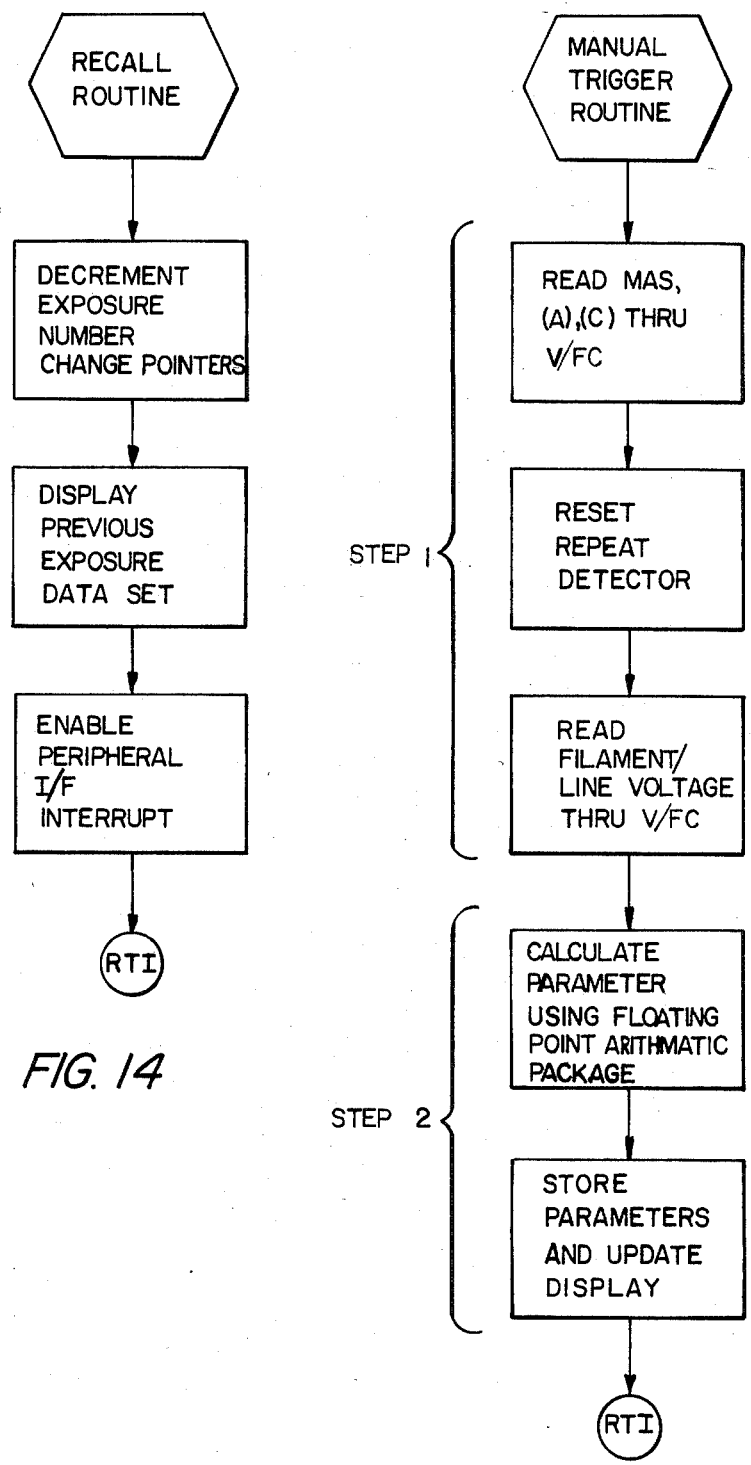

X-RAY SYSTEM TESTER

BACKGROUND OF THE INVENTION

This invention relates generally to an X-ray system tester and more particularly to an X-ray system tester adapted to measure a variety of operating parameters of an X-ray system and provide information to an X-ray equipment technician to enable such technician to test the X-ray equipment and ensure that such equipment operates properly and in accordance with certain safety requirements.

It is well known in the prior art that an X-ray beam emanating from an X-ray tube may be passed through a selected portion of a patient to produce a shadow image of the internal structure of the patient on an aligned X-ray film. The quality of the X-ray image is dependent upon the intensity of the X-ray flux which in turn, is proportional to X-ray tube anode current (mA) and to the time duration of the X-ray exposure.

The product of average anode current and X-ray exposure time duration yields an exposure quantity milliampere-seconds parameter sometimes referred to as (MAS). The parameter MAS must be large enough on the one hand to provide the desired X-ray image on the film while small enough on the other hand to protect the patient from excessive exposure to X-radiation and also protect the X-ray target from damage due to excessive heat.

Further, the quality of the X-ray shadow image is also dependent upon the penetrating ability of the X-ray beam. In operation, electrons emitted from the cathode are beamed electrostatically onto a focal spot area of an anode target with sufficient energy to generate X-rays which emanate from the anode target in a beam. The maximum energy of X-rays in the beam is proportional to the maximum kinetic energy obtained by the beamed electrons emitted from the cathode, which is a function of the voltage applied between the cathode and anode electrodes during operation of the tube. Consequently, if the selected portion of the patient is comprised of fleshy tissue the voltage applied between the cathode and anode electrodes of the X-ray beam should be relatively low in order to generate correspondingly low energy, or soft, X-rays since soft X-rays have sufficient energy to penetrate through the fleshy tissue in the selected portion and produce on the aligned film an X-ray having the desired resolution and contrast for defining detail structure. Conversely, if the selected portion of the patient is comprised of bony structure, the voltage applied between the cathode and anode electrodes should be relatively high in order to generate sufficiently high energy, or hard, X-rays which can penetrate through the more dense bony structure.

Further, the quality of the X-ray image is also related to the filament current of the X-ray tube because the anode current is a function of such filament current and the anode current establishes the X-ray flux intensity of the tube.

Still further, the quality of the X-ray image is dependent upon the regulation of the supply or line voltage supplied to the X-ray generator during an exposure interval. That is during an interval of operation of the X-ray tube the X-ray tube presents a load to the X-ray generator, which may cause a drop in line voltage. This drop in line voltage causes reductions in both anode current and the peak voltage across the anode and cathode electrodes. Thus, in order to determine if the equipment has the desired anode-cathode voltage and anode current when the equipment is in actual operation it is necessary to take into account the loading effect of the equipment on the supply.

SUMMARY OF THE INVENTION

In accordance with the present invention, an X-ray system tester is provided for measuring a plurality of operating parameters of an X-ray system such as anode voltage or cathode voltage or anode plus cathode voltage, anode current, and filament current or line voltage, such system including a selector fed by a plurality of electrical signals provided by the X-ray system and a control signal for coupling a selected one of the plurality of electrical signals, to a digitizing section for converting the selectively coupled one of the electrical signals into a train of pulses, having a frequency representative of the selectively coupled one of the electrical signals. The train of pulses is processed by a computing section which determines the value of the operating parameter in accordance with the frequency of the train of pulses. With such an arrangement, the computing section determines all the operating parameters of the X-ray system from a common form of input data, namely the frequency of a train of pulses, and thereby reduces the cost and complexity of the X-ray system tester.

In accordance with an additional feature of the invention, signals entered through a control panel provide additional inputs to the selector. These control panel signals typically include a system delay signal, a peak voltage (KV) delay signal and a trigger level signal. The selector is used to couple a selected one of the control panel signals to the digitizing section for conversion into the train of pulses again having a frequency representative of the coupled one of the control panel signals. The computing section then determines the frequency of the coupled one of control panel signals and hence the value representative of the coupled one of the control panel signals. This value, representative of the coupled one of the control panel signals, is then stored in a memory of the computing section for use during an operational interval of the X-ray generating system. With such an arrangement, the computing section is adapted to determine both the control panel signals and the parameters of the X-ray system from the same form of input data, namely the frequency of a train of pulses, to thereby, reduce the cost and complexity of the X-ray system tester.

In accordance with an additional feature of the invention, the system delay signal introduced from the control panel is used by the computing section to delay processing of X-ray system operating parameters until a period of time corresponding to the value of the system delay signal has elapsed. When such time has elapsed the computing section issues commands to initiate the computation of the selected X-ray system operating parameters. The operating parameters are only determined over a predetermined interval of time, or window, starting at the end of the delay interval. With such an arrangement, the system delay feature may be used to obtain values for anode current or filament current spaced at different points in time during different exposure intervals. The values may be used to ascertain the operability of X-ray systems employing filament/anode current regulators.

In accordance with an additional feature of the invention, the trigger level signal introduced from the front panel is stored in a memory of the computing section and is used to produce a trigger threshold signal. The stored trigger level signal is, when desired, read from the memory and is supplied by the computing section to a digital to analog (D/A) converter. The output of the D/A converter is connected to one input of a comparator. The second input of the comparator is connected to a selected one of the X-ray system operating signals. A trigger pulse is generated at the output of the comparator when the selected one of the operating parameters exceeds the trigger level signal. With such an arrangement the trigger level signal is converted to a digital word and such word is stored in a memory, to provide a trigger level signal which is not subject to drift generally associated with trigger level signals stored by using capacitors or other non digital types of storage elements.

In accordance with still another feature of the invention, the processor is adapted to store in the memory a plurality of sets of electrical signals, corresponding to a plurality of operating parameters of the X-ray system produced during a corresponding sequence of operational intervals of the X-ray system, and determine a measure of deviation for selected ones of the operating parameters over the sequence of operating intervals. With such an arrangement the X-ray system tester provides additional data to the technician when testing the X-ray system.

In accordance with still another feature of the invention, the processor is adapted to recall from storage, selectively in accordance with an operator request signal, each one of the electrical signals produced during the sequential operation. With such an arrangement, the X-ray system tester provides a further aid to the technician during testing of the X-ray system.

BRIEF DESCRIPTION OF THE DRAWINGS

The above-identified and other features of the invention will become more apparent by reference to the following description taken together in conjunction with the accompanying drawings in which:

FIG. 2 is a diagram showing the relationship between FIGS. 2A and 2B;

FIG. 2A is a block diagram of an input parameter sensing section used to sense anode current, tube voltages, and line voltage/filament current and employed in the X-ray system tester of FIG. 1;

FIGS. 7–16 are process flow diagrams useful in understanding the operation of the X-ray system tester of FIG. 1.

DESCRIPTION OF THE PREFERRED EMBODIMENT

Figure 1:
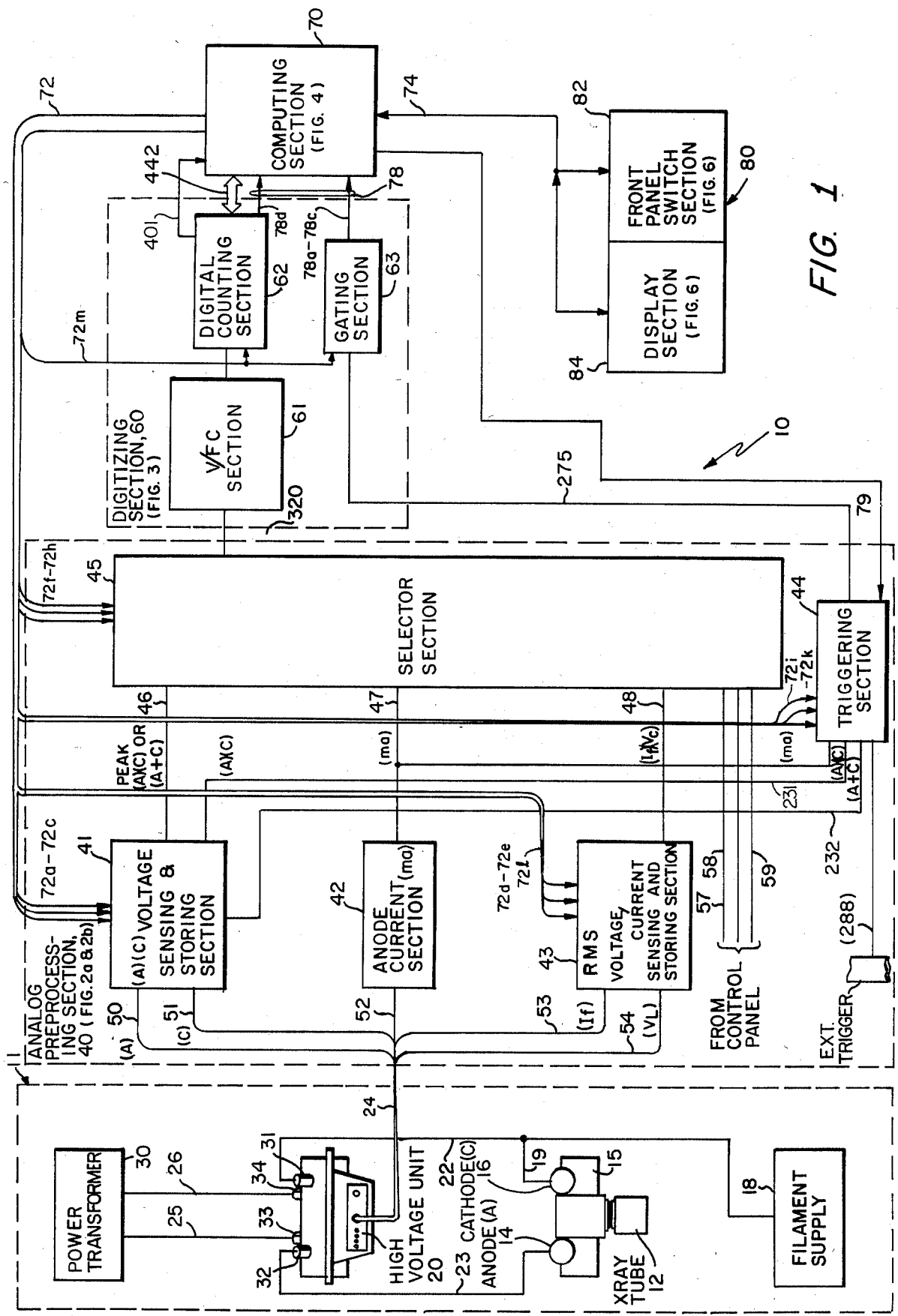
FIG. 1 is an overall block diagram of the preferred embodiment of an X-ray system tester showing a typical interface to an X-ray system.

Referring now to FIG. 1, an X-ray system tester 10 is coupled to an X-ray system 11, as shown. The X-ray system tester 10 is used to measure a set of operating parameters of the X-ray system 11, here including anode current, exposure quantity (MAS), peak cathode and peak anode tube voltages, filament current and line voltage. The knowledge of the values of these parameters will enable an X-ray equipment technician to ensure that the system operates properly and in accordance with specified safety requirements. The X-ray system tester 10 includes: an analog preprocessing section 40 disposed for electrically sensing a set of analog signals proportional to the set of operating parameters of X-ray system 11; a digitizing section 60 electrically connected to the outputs of the analog preprocessing section 40 for converting the set of analog signals into a set of digital signals representative of X-ray system operating parameters; a computing section 70 electrically connected to the digitizing section 60, for processing the digitized information produced by the digitizing section 60; a front panel section 80 having front panel control switch section 82 and display section 84 electrically connected to the computing section 70, as shown for providing control parameter information selected by the technician and for displaying the measured X-ray system parameters.

The X-ray apparatus 11 here includes an X-ray tube 12 of the conventional type, used to produce a beam of X-rays (not shown), a power transformer 30, a high voltage unit 20 fed by the power transformer 30 for producing and sensing anode and cathode voltages applied to X-ray tube 12, and a filament power supply 18. X-ray tube 12 comprises a substantially evacuated envelope 15 wherein a cathode 16 is disposed for thermionically emitting electrons onto a spaced anode target 14 to generate an X-ray beam (not shown) which emerges from X-ray tube 12 in a conventional manner. Cathode 16 here of the filmentary type, includes a terminal conductor 19 electrically connected to a filament power supply 18, which provides the necessary current for heating the cathode to electron emitting temperatures and to a negative terminal 31 of high voltage unit 20, here the type described in U.S. Pat. No. 4,034,283, granted Jan. 14, 1977, to Anthony Pellegrino and assigned to the assignee of this invention. Anode 14 is electrically connected to a positive terminal 32 of the high voltage unit 20 by a conductor 23. The high voltage unit 20 has a first high voltage input terminal 33 connected to a high voltage cable 25. The high voltage cable 25 is connected to a high voltage generator 30. The high voltage unit 20 provides low voltage output signals corresponding to the anode voltage and to the cathode voltage produced during an X-ray exposure interval. A low voltage multiconductor cable 24 which includes lines 50, 51, 52, 53 and 54, is connected to the high voltage unit 20 and is used to supply input signals for analog preprocessing unit 40. A signal representative of anode voltage (A) is produced on line 50 and a signal representative of cathode voltage (C) is produced on line 51. A signal representative of anode current (ma) is produced on line 52, a signal representative of filament current ($I_F$) is produced on line 53 and a signal representative of line voltage ($V_L$) is produced on line 54.

The analog preprocessing unit 40 (explained in further detail in conjunction with FIGS. 2A and 2B) includes an anode or voltage cathode (A)/(C) sensing and storing section 41, an anode current (ma) section 42, an RMS voltage or current sensing and storing section 43, a trigger section 44 and a selector section 45. The processing unit 40 is coupled to the X-ray system 11 by the multi-conductor cable 24. Low voltage cables 50 and 51 of cable 24 are connected to a A/C voltage sensing and storing section 41. The (A)/(C) voltage sensing and storing section is used to sense either peak anode voltage (A), or peak cathode voltage (C), or peak anode plus cathode voltage (A+C), selectively in accordance with a control signal fed thereto from computing section 70 via lines 72a–72c in a manner to be described hereinafter. Low voltage cable 52 of cable 24 is connected to an anode current section 42, such section 42 being used to isolate an input voltage signal proportional to X-ray tube anode current (ma), here produced by the high voltage unit 20 from the selector section 45. The input voltage signal proportional to anode current (ma) is here generated from an anode current sensor (not shown) within high voltage unit 20 of a type disclosed in my U.S. Pat. No. 3,963,931 entitled "X-ray Tube Current Monitor" issued June 15, 1976 and assigned to the assignee of this invention. Low voltage cable 53 of cable 24 is used to connect the RMS voltage/current sensing and storing section 43 to a filament current sensor which provides a signal representative of the RMS value of filament current. The filament current sensor (not shown) within high voltage 20 is here of a type disclosed in U.S. patent application Ser. No. 167,997, filed July 14, 1980, entitled "X-ray Tube Voltage Indicator" by Richard L. Barrett, and assigned to the assignee of this invention. Cable 54 of cable 24 is used to connect section 43 to line voltage sensor, which provides a signal representative of the RMS value of line voltages. The line voltage sensor is here of a type disclosed in the above-mentioned U.S. patent application Ser. No. 167,997. The RMS voltage/current sensing and storing section 43 is used to convert the RMS value, the X-ray tube filament current (IF) or the X-ray generator line voltage ($V_L$) to a DC or average value signal selectively in accordance with a control signal fed thereto from computing section 70 via lines 72d–72e and 72l in a manner to be described.

Selector section 45 is electrically connected, via a first input line 46, to the output of (A)/(C) voltage sensing and storing section 41; via a second input line 47 to the output of anode current section 42, and via a third input line 48 to the output of RMS voltage/current sensing and storage section 43. Selector section 45 is also connected to control panel 82 via input lines 57, 58 and 59 which couples to selector section 45 the analog voltage levels representative of control panel 82 parameters to be discussed in further detail in conjunction with FIG. 2A. Suffice it to say here, however, that selector section 45 is used to couple one of the input lines 46, 47, 48, 57, 58 or 59 to the output of the selector section 45 selectively in accordance with a control signal fed to such section 45 from a computing section 70 via bus 72f–72h in a manner to be described.

The triggering section 44 is used to produce a trigger pulse signal during an exposure interval from a selected one of the plurality of trigger signal sources. Such trigger signal sources, including instantaneous anode current, (ma) instantaneous anode plus cathode voltage (A+C) anode voltage (A) or cathode voltage (C) selectively in accordance with a control signal produced by computer section 70 and fed to trigger section 44 via lines 72i–72k in a manner to be described. This trigger pulse signal is used by computing section 70 to determine the start and duration of the exposure interval.

Figure 3:
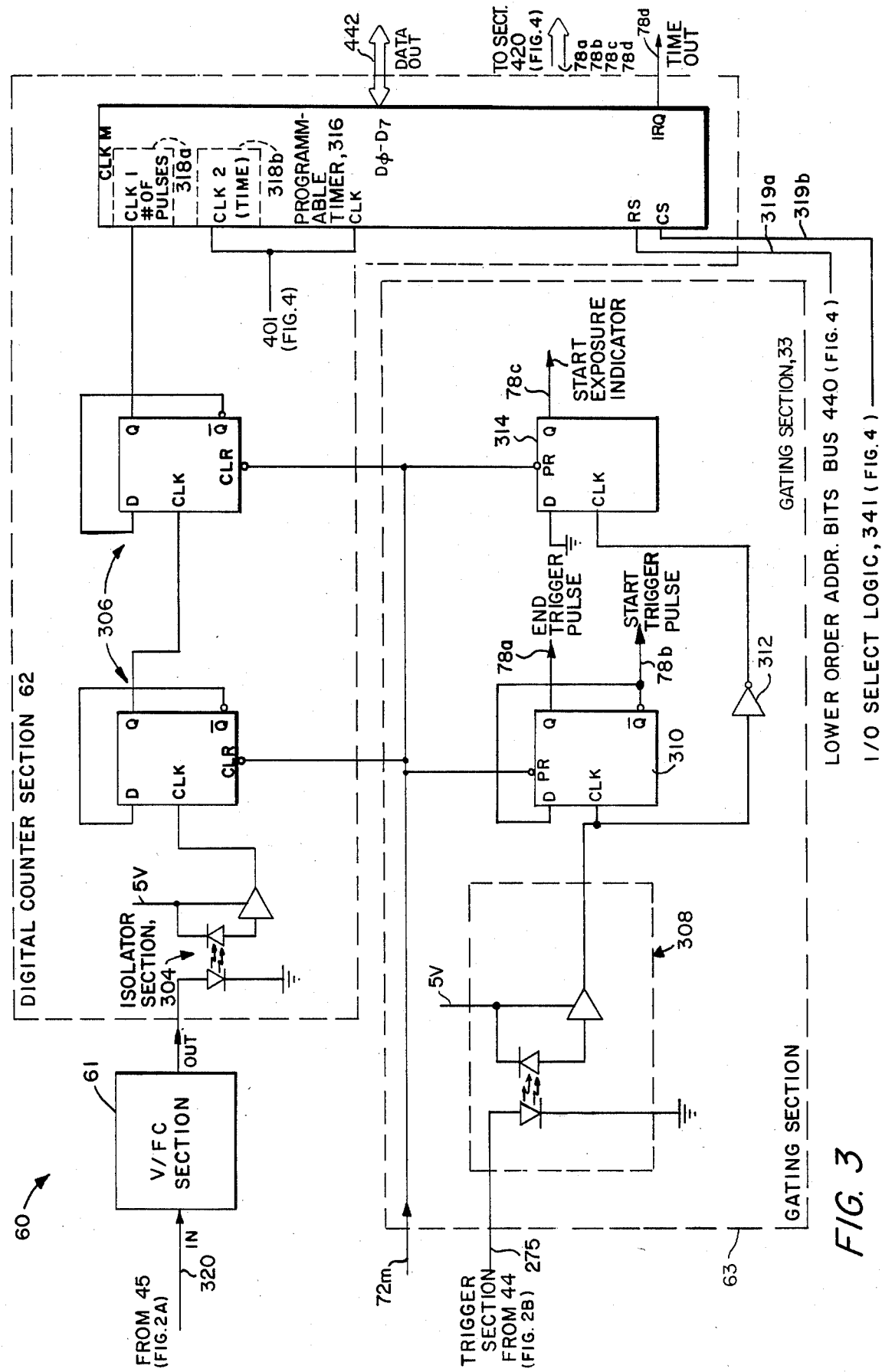
FIG. 3 is a block diagram of the digitizing section used in the X-ray system tester of FIG. 1.

A digitizing section 60 includes a voltage to frequency converter (V/FC) 61, digital counting section 62 and gating section 63 explained in further detail in conjunction with FIG. 3. Section 60 is coupled to the preprocessing section 40 as shown. The voltage to frequency converter section 61 is used to convert the output of the parameter selector section 45 into a train of pulses having a frequency proportional to the level of the parameter selectively coupled to the output of selector section 45. The output of the voltage to frequency converter section 61 is connected to the digital counting section 62, such section 62 being used to count the number of pulses in the pulse train during the exposure interval. This count is used to determine the value of the coupled parameter in a manner to be described in conjunction with FIG. 4. The output of the triggering section 44 is connected to gating section 63. The gating section 63 generates signals for computing section 70 which indicate to the computing section 70 the beginning and end of the exposure interval.

Computing section 70 (explained in further detail in conjunction with FIG. 4) is connected to the digitizing section 60 and preprocessing section 40, as shown. The computing section 70 supplies control signals to the analog preprocessing section 40 via X-ray calibrator control bus 72. Control bus 72 includes lines 72a–72m. Front panel bus 74 is electrically connected to the front panel section 80 and is used to couple signals to display section 84 and to couple input signals from front panel controls section 82 to computing section 70.

Now referring to FIG. 2A, the analog preprocessing section 40 is shown in detail to include the (A)/(C) voltage sensing and storing section 41 which detects and stores a peak voltage signal of either anode voltage (A) or cathode voltage (C) carried by cables 50 and 51, respectively, as mentioned above. More particularly, the (A)/(C) sensing and storing section 41 includes a conventional amplifier 204 having an inverting input (−) connected to anode voltage (A) sense cable 50. The amplifier 204 is used to buffer a voltage signal proportional to X-ray tube anode voltage (A) during an exposure interval. The analog voltage (A) signal is proportional to X-ray tube anode voltage, here one volt at the output of amplifier 204 represents twenty kilovolts of anode voltage. The output of amplifier 204 is applied to a first input of analog switch 210, as shown. The (A)/(C) sensing and storing section 41 also includes a second amplifier 216 connected to cathode voltage (C) sense cable 51. Such amplifier 216 is also used to buffer a voltage signal proportional to X-ray cathode voltage (C) during an X-ray exposure interval. The analog voltage signal is proportional to X-ray tube cathode voltage, (C), here as one volt per twenty kilovolts of cathode voltage. The output of amplifier 216 is applied to a second input of analog switch 210.

Analog switch 210 is fed by control signals from computing section 70 (FIG. 1) via control lines 72a, 72b. A control signal on line 72a is used to selectively couple or decouple the anode voltage (A) on line 50 to one input 217' of a voltage divider 217. A control signal on control line 72b is used to selectively couple or decouple the cathode voltage (C) on line 51 a second input 217" of output voltage divider 217. The voltage divider 217 is connected to a noninverting input (+) of a summing amplifier 222. The output of summing amplifier 222 therefore represents anode voltage (A) when the control signal on line 72a couples amplifier 204 to input 217 and represents cathode voltage (C) when the control signal on line 72b couples amplifier 216 to input 217. The output of amplifier 222 is applied to a peak voltage detector section 226, such section 226 being used to detect the peak of the applied voltage signal, here either anode voltage (A) or cathode voltage (C). The output of the peak voltage detector section 226 includes an amplifier 225, a buffer 228, a capacitor 230 and a reset line 224, connected as shown. Capacitor 230 stores a charge which is proportional to the peak voltage produced at the output of amplifier 225. Buffer 228 is used to prevent discharge of capacitor 230 prior to sampling by the computing section 70 (FIG. 1). Reset line 224 is used to discharge capacitor 230 to ground through a field effect transistor (FET) switch 223 in response to a control signal fed to control line 72c from computing section 70 (FIG. 1). It is here noted that the capacitor 230 is reset prior to an exposure interval. Thus the capacitor 230 stores a signal representative of either peak anode voltage (A) or cathode voltage (C). The output of voltage divider network 217 is, in addition fed to amplifier 222 and fed to a resistor 219 to produce a signal on line 232 representative of the sum of the anode voltage (A) and cathode voltage (C); i.e. a sum signal (A+C), when the control signals on lines 72a and 72b couple amplifier 204 to input 217' and amplifier 216 to input 217". It is noted that when both amplifiers 204 and 216 are coupled to voltage divider 217, the sum of both signals anode voltage and cathode voltage is obtained since in general neither signal is referenced to a ground potential.

The RMS voltage/current sensing and storing section 43 is used to convert the filament current ($I_F$) and the line voltage ($V_L$) carried by cables 53 and 54, respectively, to corresponding RMS voltage signals. Section 43 includes a conventional buffer amplifier 244 having a noninverting input (+) connected to filament current ($I_F$) sense cable 53. The output of buffer section 244 is connected to a input 245 of analog switch 246. The other input 247 of analog switching section 246 is connected to line voltage sense cable 54. Analog selector switch 246 is fed by signals on control lines 72d and 72e of computer control bus 72. The signals on lines 72d and 72e are used to selectively couple the RMS values of either the filament current ($I_F$) or line voltage ($V_L$) to the output of analog switch 246. The output of analog switch 246 is connected to a conventional RMS to DC converter 248. The output of the RMS to DC converter 248 is connected to a conventional sample and hold section 250. A sampling signal for the sample and hold section 250 is supplied through control line 72l from computing section 70 (FIG. 1). The DC value of either filament current ($I_F$) or line voltage $V_L$ is stored on capacitor 252.

Cathode current section 42 is a conventional amplifier used to buffer an input voltage signal proportional to cathode current ($I_C$) carried by cable 52, as shown.

Figure 2B:
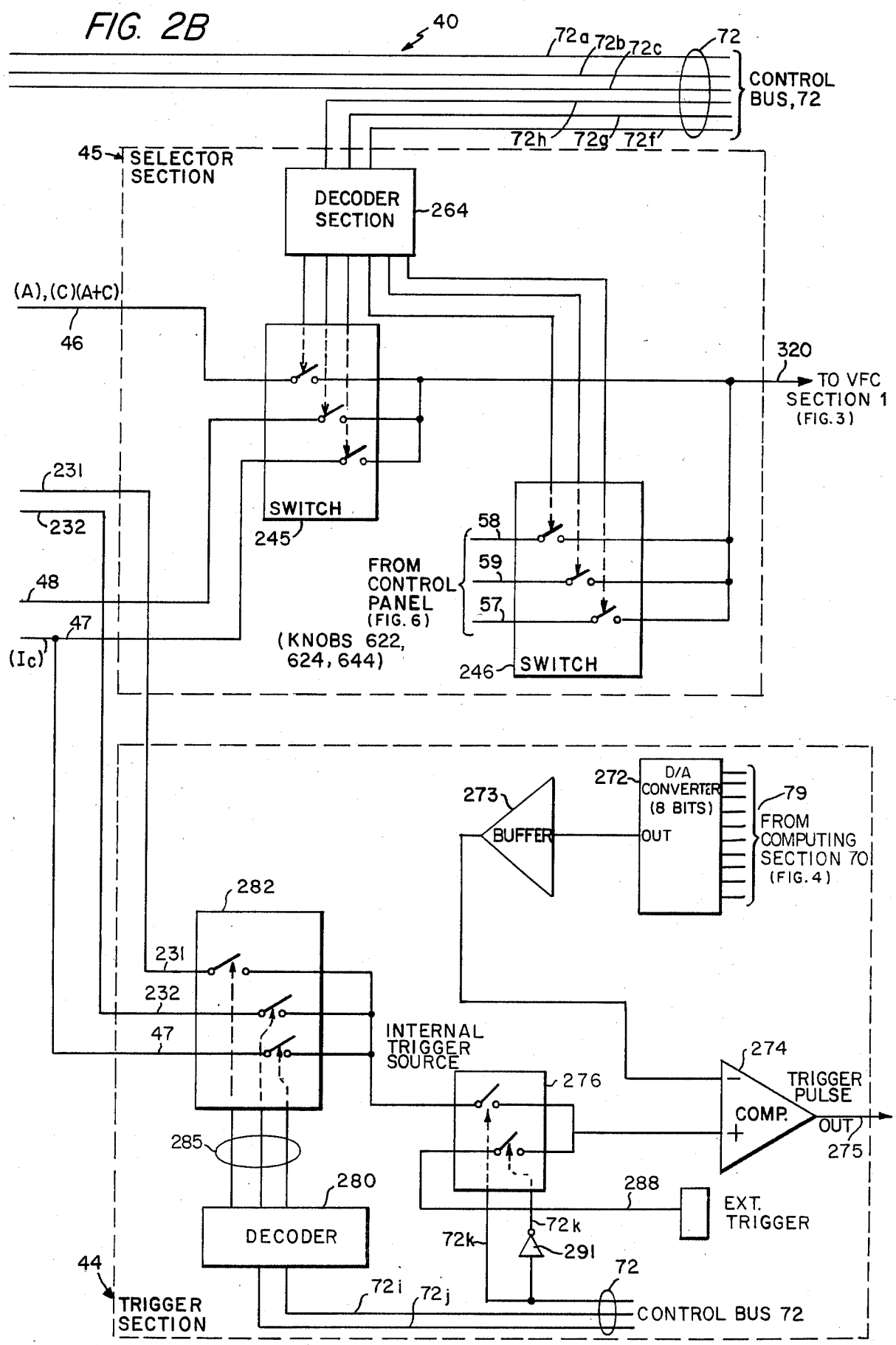
FIG. 2B is a block diagram of a selector section and triggering section employed in the X-ray system tester of FIG. 1.

Now referring to FIG. 2B, selector section 45 includes a switch 245 having a plurality of input lines, here lines 46, 47, 48 and a second switch 246 having a plurality of input lines, here lines 57, 58, 59. Lines 46, 47, 48 are used to couple signals at the outputs of (A)/(C) voltage sensing and storing section 41, cathode current section 42 and RMS voltage/current sensing and storing section 43 (FIGS. 1 and 2A) to switch 245 and lines 57, 58 and 59 are used to couple signals to switch 246 from the front panel 84. Selector section 45 further includes a decoder 264. Decoder 264 is used to decode signals on control lines 72f-72h of bus 72 produced by computing section 70 to provide control signals for switches 245, 246. These control signals are used to selectively couple one of the plurality of inputs fed to selectors 245, 246 via lines 46, 47, 57, 58, 59 to output line 320 of parameter selector section 45. As mentioned above, the signals on lines 46, 47, 48 represent: peak anode voltage (A), peak cathode voltage (C) or peak anode plus cathode voltage (A+C); filament current ($I_F$) or line voltage ($V_L$); and anode current (ma) respectively. The signal on line 57 represents a trigger level signal, the signal on line 58 represents a system delay signal, and the signal on line 59 represents a kilovolt (KV) signal. A line 320 is fed to V/FC section 61 FIG. 1). With such arrangement, analog signal levels on lines 57, 58, 59 which are proportional to control panel signals and X-ray operating parameter signals on lines 46, 47, 48 are channeled to a common digital conversion circuit, namely, the voltage to frequency converter 61, here a voltage controlled oscillator. This common channel processing arrangement eliminates the need for an expensive A/D converter for each signal.

Triggering section 44 has inputs coupled to here (A)/(C) voltage sensing and storing section 41 via lines 231, 232 and anode current section 42 via line 47 as shown. Triggering section 44 here includes trigger signal selector 282 having a first input 232 connected to voltage divider 217 (FIG. 2A) via line 232, the signal produced by divider 217 providing a first triggering source signal proportional to the sum of anode and cathode (A+C) voltage. Trigger selector 282 is also connected to the output of differential amplifier 42 (FIG. 2A) via line 47. This input provides a second trigger source signal proportional to anode current (ma). Trigger selector section 282 further includes a third input connected to the output of summing amplifier 222 (FIG. 2A) via line 231. This input provides a third trigger signal proportional to anode X-ray tube voltage (A) or cathode X-ray tube voltage (C). Trigger signal selector 282 couples one of the inputs to output of selector 282 selectively in accordance with control signals on lines 285. The output of selector 282 is an internal trigger source. The control signals on line 285 are produced by a conventional decoder 280; such decoder 280 decodes control signals on lines 72i, 72j from computing section 70. The output of selector 282 is connected to an input 283 of a second trigger selector 276. An additional input for the second trigger signal selector 276 is connected via line 288 to an external trigger source which may be entered from a connector mounted on the chassis (not shown) of the X-ray testing system. Second trigger selector 276 is used to select between the internal and external trigger source signals in accordance with control inputs 72k and $\overline{72k}$. Control signal $\overline{72k}$, which is obtained from inverter 291 is the complement of 72k. An active high level on the control line 72k will cause internal trigger source to be selected whereas a low on line 72k will cause the output of inverter 291 which is connected to control line $\overline{72k}$ be high, thus selecting the external trigger source. The selection of each trigger signal is explained in further detail in conjunction with FIG. 5. These signals are used to select one of the inputs of second trigger selector 276 to a noninverting input (+) of a comparator 274. The inverting input of comparator 274 is connected to the output of a buffer 273. This buffer 273 couples a signal from an 8-bit digital-to-analog (D/A) converter 272 which corresponds to a reference signal fed to the D/A converter from computing section 70 via bus 79 in a manner to be described. Suffice it to say here, however, that when the level of the selected trigger source signal coupled to the output of selector 276 exceeds the level of the reference signal provided by buffer 273, a trigger pulse is produced from comparator 274 on line 275. The trigger pulse on line 275 is fed to gating section 63 (FIG. 1). As will be described hereinafter the trigger pulse is used by the gating section 63 to provide signals to computing section 70 for reasons to be discussed.

Now referring to FIG. 3, digitizing section 60 includes a voltage to frequency (V/FC) section 61 connected to the output of selector section 45 via line 320 as shown. Voltage to frequency converter section 61 here, a voltage controlled oscillator, is used to produce a train of output pulses having a frequency proportional to the level of an applied input signal voltage on line 320. The output of voltage to frequency converter section 61 is connected to an opto-coupler 304 (here a conventional light-emitting diode and photodetector) of digital counter section 62. The opto-coupler 304 is here used to isolate analog signals and analog grounds from digital signals and digital grounds to achieve better noise immunity. The output of optocoupler section 304, a replica of the output of the V/F converter section 61.

Digital counting section 62 also includes a conventional divide by 4 prescaler section 306. This prescaler section 306 is here used to scale the input pulse train to a lower pulse repetition level. This results in fewer timeout interrupts from timer section 62 occurring during an exposure interval The technique for handling timeout interrupts will be discussed in conjunction with FIGS. 7-16. Suffice it here to say that the reduced number of interrupts reduces the computing load on computing section 70.

The output of the prescaler section 306 is connected to a first asynchronous clock input CLK1 of the programmable timer 316. The programmable timer 316, here part number MC6840 manufactured by Motorola Semiconductor Products Inc., Phoenix, Ariz., includes a pair of programmable counters 318a–318b, each one having an asynchronous input fed thereto at CLCK1, CLCK2 respectively. The train of pulses connected to input CLK1 are applied to counter 318a. A train of pulses having a known frequency is produced by a known frequency source CLCK here the internal system clock supplied by computing section 70, via line 401, and is fed to a second asynchronous clock input CLK2 and is applied to counter 318b. The master clock CLCK (FIG. 1) of computing section 70 feeds clock pulses on line 401 to the programmable timer 316 at terminal CLK to clock in pulses at terminals CLK1, CLK2. The programmable timer 316 further includes an interrupt request line 78d which is the output of an "OR gate" whose inputs are overflow signals from the pair of programmable counters 318a–318b. The interrupt request line 78d is asserted each time one of the pair of programmable counters 318a, 318b reaches a preprogrammed number of counts. The pre-programmed number is selected by the program and is provided by the stored program. Suffice it to say here, that when an interrupt occurs on line 78d, the computing section 70 determines which one of the timers 318a, 318b initiated the interrupt. In this way the computing section 70 is able to determine from counter 318a, the number of pulses fed to input CLK1 in a time interval determined by the number of pulses fed to timer 318b via input CLK2, and hence the frequency of the pulses to the counter 318a. Computing section 70 will re-program the counters for new count sequences and re-enable the timer section 316 for new interrupts.

Digitizing section 60 further includes a gating section 63. Gating section 63 includes, an opto-coupler 308 whose input is connected to the output of the triggering section 44 via line 275. The signal produced by the opto-coupler 308 is essentially a replica of the trigger pulse on line 275. The output of opto-coupler 308 is connected to the clock input of flip flop 310. A positive transition on the output of opto-coupler 308 will cause the output of flip flop 310 to change to the state presently occurring on the D input to the flip flop 310. The D input to flip flop 310 is connected to its $\overline{Q}$ output, thus flip/flop 310 is connected as a toggel flip flop. The Q output of flip flop 310 is connected to the calibrator status and interrupt bus 78 here via line 78a. The $\overline{Q}$ output of flip flop 310 is also connected to computer section 70 via calibrator status and interrupt bus 78 here via line 78b. Lines 78a and 78b are monitored by the computing section 70 (FIG. 1) to determine the start and the end, respectively, of the trigger signal pulse on line 275. When a signal on lines 78a, 78b is generated, an interrupt to be discussed in conjunction with FIG. 11 is produced. In response to this interrupt the contents of timers 318a, 318b are stored in a memory of computing section 70 in response to signals fed to the programmable timer 316 from the computing section 70 via bus 442 and enable signals fed to chip select (CS) and register select (RS) lines 319a, 319b. Suffice it to say here, that when interrupts occur on lines 78a, 78b, the computing section 70 reads the contents of the timers 318a, 318b via bus 442. The contents of each timer 318a, 318b are then stored in a memory of the computing section 70. The output of opto-coupler 308 is also connected to the input of an inverter 312 whose output is connected to a clock input of a second flip flop 314. A positive transition on the output of isolator 308 will cause the clock input on flip flop 314 to clock in a logic zero signal. The D input of flip flop 314 is always connected to ground. The Q output of flip flop 314, referred to here as the "start exposure indicator" signal, is connected via line 78c to calibrator status and interrupt bus 78. This signal, as with the "start trigger" and "end trigger" on lines 78a and 78b, respectively, are monitored by the computing section 70. The start exposure indicator signal is used to indicate to the computing section 70 the start of an exposure interval. The flip flops 310, 314 and the pair of flip flops 306 in scaler section 62 are all initialized by a control signal produced on a line 72n by computing section 70.

Figure 4:
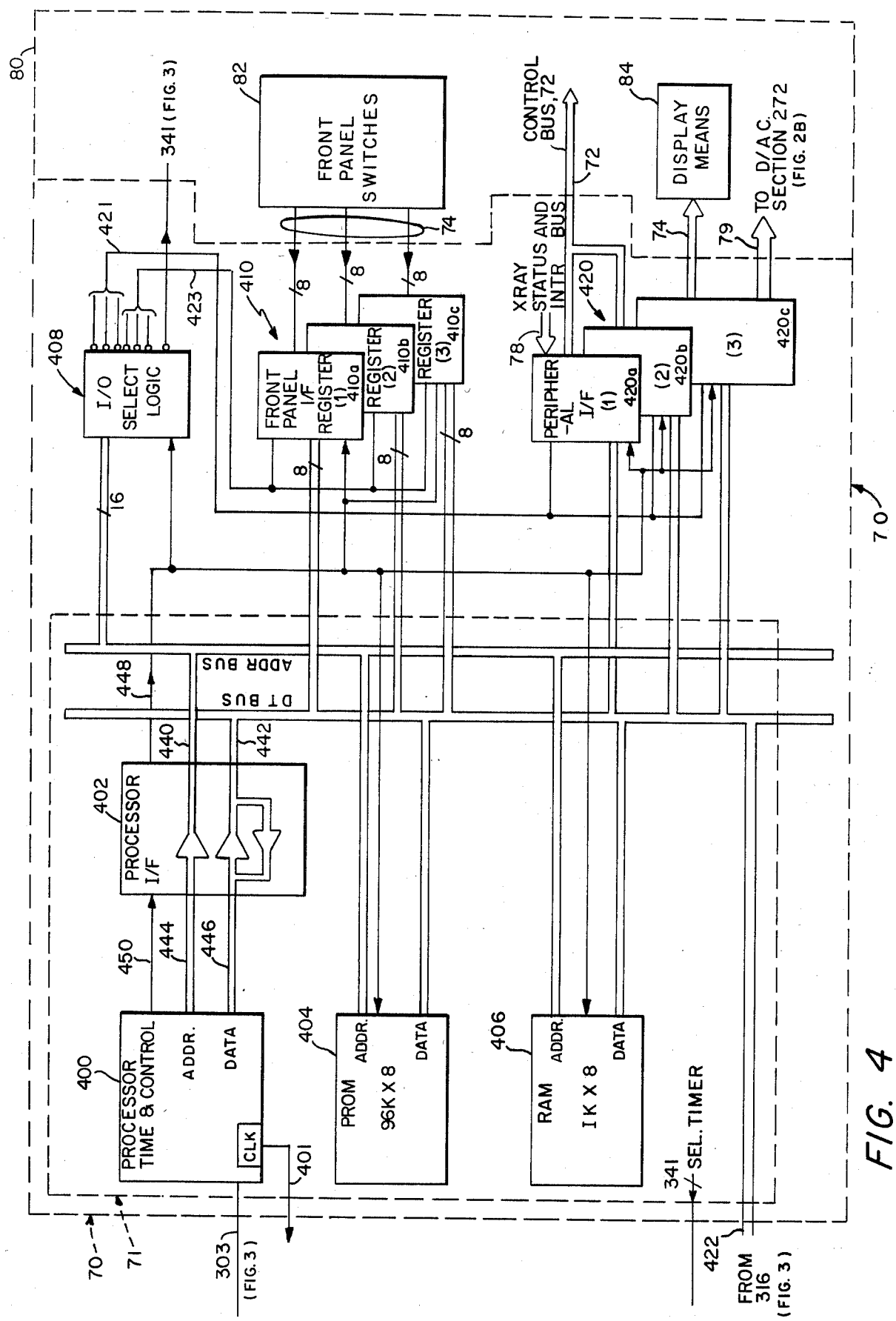
FIG. 4 is a block diagram of the computing section used in the X-ray system tester of FIG. 1.

Now referring to FIG. 4, the computing section 70 includes a processor section 71, front panel interface section 410, input/output select logic section 408 and peripheral interface section 420 connected as shown. The processor section 71 includes a microprocessor 400 here a Motorola 6802, having a processor interface section 402, a program memory 404, a data memory 406, an address bus 444, data bus 446 and timing and internal control bus 450. The processor section further includes the system clock (not shown) and supplies a clock signal via line 401 to the timer 316 (FIG. 3). These buses are connected to the inputs of processor interface section 402. Processor interface section 402 is used to buffer the address bus 444 and data bus 446 from the remainder of the system. Processor interface section 402 also buffers all the internal timing and control signals required by computing section 70. The output of processor interface section 402 includes buffered data bus 440, the buffered address bus 442 and the buffered timing and control bus 448. Signals on these buses are used to interface the processor 400 with the program memory 404, data memory 406, the I/0 select logic section 408, the front panel interface section 410 and the peripheral interface section 420, in a conventional manner.

Program memory 404, here a conventional programmable read only memory (PROM), stores a sequence of instructions for providing control signals on bus 72 through the peripheral interface I/F 420 for the preprocessing section 40 and the digitizing section 60 (FIG. 1). This sequence of instructions controls (A/C) sensing and storage section 41 (FIG. 1), RMS voltage/current sensing and storage section 43 (FIG. 1), selector 45 (FIG. 1) and gating section 63 (FIG. 1).

Data memory section 406, here a conventional random access memory (RAM), operates as a scratch pad memory to store intermediate data used in calculating the selected operating parameter passed through selector section 45 and converted into a digital signal by digitizing section 60 and also stores sets of such operating parameters produced in response to a plurality of exposures and used to determine coefficients of variation of a selected operating parameter over the plurality of exposures in a manner to be described.

The I/0 select logic section 408 is here a conventional decoder, used to produce control signals on output lines 423 and 421 to control front panel interface section 410 and peripheral interface section 420 respectively. When the processor 400 places an I/0 address on the address bus 440 such address is decoded by the I/0 select logic 408. The I/0 address selects the front panel data for use by the computing section 70 and provides the display section data.

The front panel interface section 410 includes a plurality of registers 410a, 410b, 410c used to store data introduced from the front panel switches 82. The control panel 82 will be explained in further detail in conjunction with FIG. 6.

Peripheral interface section 420 includes here three peripheral interface adapters (PIA) 420a-420c part number MC6821 manufactured by Motorola Inc., Phoenix, Ariz. A peripheral interface adapter (PIA) for example, PIA 420a includes two programmable 8 bit parallel channels (not shown) which may be dynamically configured as input or output channels. Suffice it to say here that the computing section 70 will supply data via the data bus 442 to a selected one of the programmable channels of a selected one of the PIA's in accordance with control and status information determined by the computing section 70 during an operational interval of the X-ray system tester. The peripheral interface section 420 provides or accepts signals from bus 72, bus 78 and bus 79.

The X-ray system tester 10 determines the value of an operating parameter of the X-ray system, or a control parameter as follows: the selected parameter to be determined, for example anode current (ma), is coupled to the output of selector 45 (FIG. 1) in accordance with control signals fed via lines 72f-72h (FIG. 2B). The coupled signal is converted to a train of pulses by the V/F converter 61 having a frequency proportional to the voltage level representative of anode current (ma). This train of pulses is then fed to the digital timer 316 (FIG. 3) at input CLK1. The timer 318a then counts the number of pulses in the pulse train. At a time related to the start of the exposure interval, the timer 318b starts counting the number of pulses of the known frequency supplied via line 401 coupled to input CLK2. The number of pulses in both pulse trains (i.e. the digitized cathode current parameter and the known frequency source) are counted by the timers 318a, 318b until the occurrence of an overflow interrupt, as described, in which case the contents of the timers 318a, 318b are stored in the computing data memory 406. At the end of the exposure interval as determined by the computing section 70, the value of the selected parameter here (ma) is determined by first determining the duration of the exposure interval, T, (here the number of counts in timer 318b divided by the frequency of the known frequency source CLCK). The number of counts in timer 318a here represents MAS. The value of (ma) is then determined by dividing the total number of counts obtained from timer 318a by the exposure interval, T, (this value here now, representing the anode current (ma)) i.e. the average anode current (ma) measured over the exposure interval as discussed above. Thus, with a knowledge of the voltage/frequency scale factor for the V/F converter 61 (FIG. 1) and the voltage scale factors for the preprocessing section 40 and X-ray system current sensor (not shown), the value of the anode current (ma) is then calculated by the computing section 70 as MAS/T=ma. In a similar manner, peak anode voltage (A) or peak cathode voltage (C) or peak anode plus cathode voltage (A+C) or filament current ($I_f$) or line voltage ($V_L$) or the trigger level signal on line 57 or system delay signal on line 58 or the KV delay signal on line 59 (FIGS. 2/3) may be determined by coupling one of the above-mentioned parameters to the V/F converter section 61 via the selector 45 as described above. The number of pulses in the resulting pulse train is counted in a similar manner as described above. However, unlike the determination of anode current (ma) and MAS, as described above, the timer 318b determines the number of pulses of the known frequency source CLCK as described over a measurement interval, the duration of which is controlled by the computing section 70 in accordance with a preselected time interval rather than over a time interval related to the exposure interval.

Referring now to FIGS. 5A-5E, examples of various triggering modes will be described. A selected triggering source signal is used to produce the trigger pulse on line 275 (FIG. 2B). The trigger pulse is used to indicate to the computing section 70 the initialization of an exposure interval. Anode current (ma), cathode voltage (C), anode voltage (A), an external trigger signal may be used as the trigger source signals fed to comparator 274

(FIG. 2B). Anode current (ma) or anode voltage (A) or cathode voltage (C) may be used as trigger signal sources in one of two modes. In a first mode a preselected threshold level of the selected source signal is provided to the X-ray tester 10 by the technician via a control panel 82 to be described in connection with FIG. 6. In a second mode the threshold level is selected by the technician as a preselected percentage of the actual value of the level of such signal during the last previous exposure. That is, for example if the selected trigger signal source is anode current (ma), in the second mode the technician selects as the trigger level a percentage of the level of anode current actual produced by the X-ray system during the last previous exposure.

Anode current triggering is useful in systems where long cable lengths cause the cables to hold a charge at the end of the exposure. For example, referring to FIG. 5A the anode or cathode voltage waveform as a function of time is shown for a system having long cable lengths. It is noted that at the end of the exposure the anode or cathode voltage does not rapidly return to zero because of the capacitance of the cables, hence use of anode or cathode voltage as a trigger signal source in such system is not desirable because of the error introduced in measure of exposure time interval. By triggering on X-ray tube anode current, however, the exposure time will be determined accurately since such current will go to zero when X-ray emission stops.

Figure 5A:
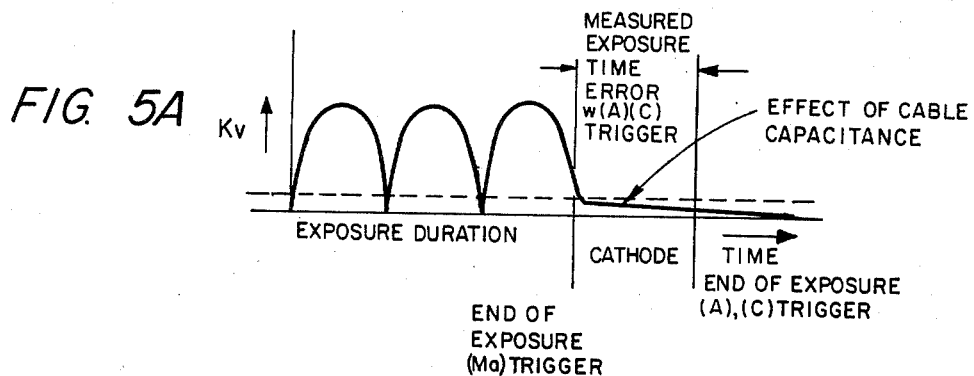
FIG. 5A is a time history of a tube voltage derived trigger signal used by the X-ray system tester of FIG. 1 and a pictorial representation showing the effect of an anode current derived trigger to compensate for cable capacitance error introduced by the tube voltage derived trigger signal.
Figure 5B:
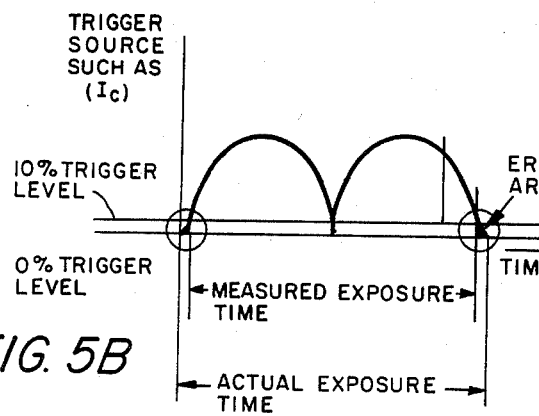
FIGS. 5B and 5C are time histories of a trigger source signal such as anode current, to illustrate the effect of trigger level on measured exposure time.
Figure 5C:
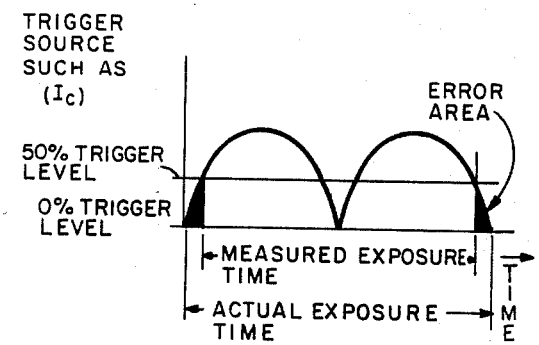

FIGS. 5B & 5C show an operating parameter for example anode current from selector 45, and the actual and measured time of exposure for a 10% and a 50% trigger level from amplifier 273. With a 10% trigger source level the expected error area is shown under the curve from zero trigger level point to 10% trigger level point and the measured time of exposure is shown within the two points. At a trigger level of 50%, as shown in FIG. 5c, the error area gets correspondingly larger and the measured exposure time is correspondingly smaller. With a 10% trigger level this corresponds to error of 0.53 ms, and at a 50% trigger level this error is nearly four times as great corresponding to an error of 2.7 ms. Since time and cathode current are intimately related, (cathode current is a value calculated from time, as explained previously), the selection of the proper trigger level is sometimes critical in order to obtain correct anode current measurements. Generally for single phase systems, the trigger level should be set as low as possible the electrical noise present) in order to obtain an accurate reading. For most single-phase applications, the proper trigger level is 10% of the trigger source. For three phase systems, the trigger level should be set to the intersection of the voltage pulse with 75% of the peak voltage signal, unless the equipment manufacturer recommends a different trigger level.

Figure 5D:
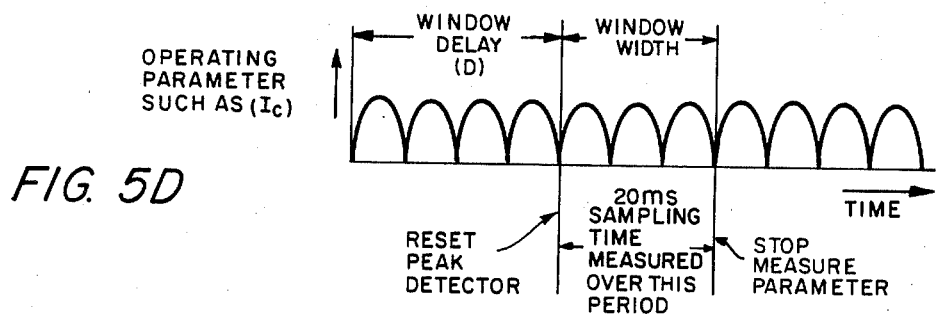
FIG. 5D is a time history of line voltage useful in understanding the system delay concept of the X-ray system tester of FIG. 1, in measuring line voltage under a falling load condition.
Figure 6:
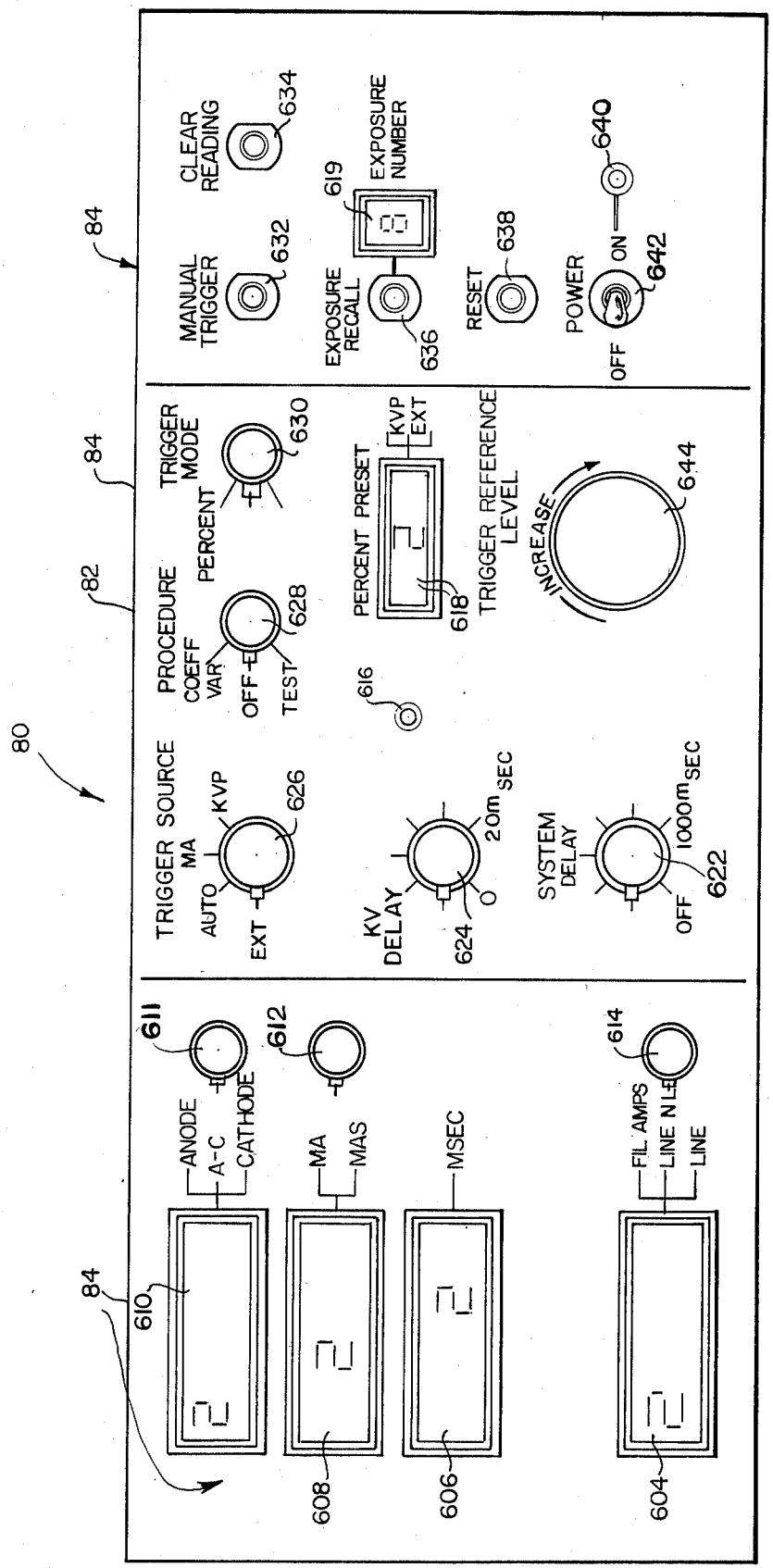
FIG. 6 is the front panel of the X-ray system tester of FIG. 1.

A system delay feature as shown in FIG. 5D is here included in the X-ray system tester as explained previously. The system delay feature allows measurements to be taken over a fixed interval, here as 20 ms, after a variable system delay D of up to 1 second for example has elapsed. Some applications for which a system delay feature may be useful are given below. With a falling load generator, with several current values and time intervals between these values, a window is desired to set KV peak and emission at each step. A falling load anode current (ma) waveform is illustrated in FIG. 5D. To utilize the system delay mode, the system delay control 604 as further explained in conjunction with FIG. 6 is turned to a delay greater than a minimum activation delay period such as fifty milliseconds. A predetermined sampling period here twenty milliseconds is used by the computing section 70 when the system delay mode is selected. The value of the parameter measured is not the value over the entire exposure but only the value over the twenty millisecond interval. Thus, anode current is averaged over a twenty millisecond interval that is $ma_{(ave)} = MAS/0.02$. Another application for the system delay feature is as a test for systems employing automatic filament/anode current control.

Figure 5E:
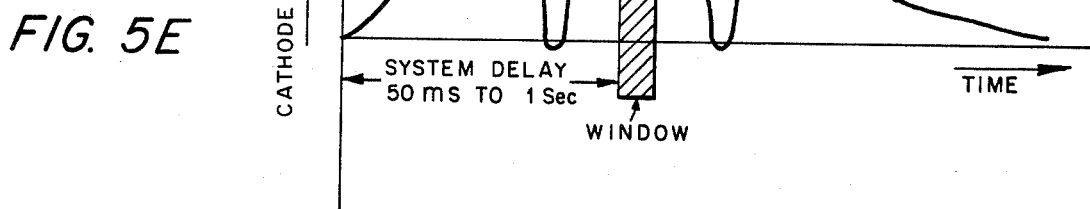
FIG. 5E is a time history of anode current useful in understanding the system delay concept of the X-ray calibrator system of FIG. 1 and such concept being used to investigate anode current regulator action during a selected time interval.

Referring to FIG. 5E, anode current waveform is a function of exposure duration (time) is shown with the system delay feature sampling the waveform here anode current (ma) at a selectable portion of the exposure interval. The system delay is set to zero, for the first exposure, the exposure is made and the data recorded. Then the system delay position is set to one hundred milliseconds for example, and a second exposure is then made. At this point the regulator action of anode current (ma) would have begun. By comparing the anode current readings, the operation of the regulator could be analyzed.

Now referring to FIG. 6 the front panel section 80 which is connected to the computing section 70, as shown in FIG. 1, includes a display section 84 and a control section 82, as shown. Display section 84 further includes a display 604 used to display filament current ($I_F$ "FIL AMPS") or line voltage ($V_L$ "LINE") or line voltage of a falling load generator ($V_L$ "LINE N/L"). The desired measurement is here selected prior to exposure by positioning control knob 614, as indicated. Display 606 displays the measured exposure time in milliseconds ("MSEC"). Display 608 displays alternatively anode current in milliamps ("MA") or exposure quantity in milliampere-seconds ("MAS") selectively in accordance with the position of knob 612. Values for both parameters are here stored in computing section 70 and can be selectively displayed after exposure by knob 612. Display 610 displays the measured anode voltage (A) "ANODE"), "CATHODE" or anode plus cathode voltage ("A+C"). The desired measurement must here be selected by control 611 prior to the exposure. "Percent/Preset" display 618 is used to display the trigger level provided by the technician through a trigger level control 644. Such trigger level is used to generate the voltage at the output of amplifier 273 (FIG. 2B) of triggering section 44 as described above. "Exposure number" display 619, is used to display the exposure number of a selected one of a set of exposures in a manner to be discussed in conjunction with control panel 82. Suffice it to say here that such display presents to the technician the number of the exposures which have been taken in the current series of exposures.

Control panel 82 includes a system delay control 622, here a potentiometer used to generate a voltage corresponding to a variable delay over the range of zero to one thousand milliseconds as described in connection with FIGS. 5D and 5E. "KV delay" potentiometer 624 is used to generate a delay up to twenty milliseconds, prior to resetting the peak detector capacitor 230 (FIG. 2A). The KV delay when used by the computer section 70 allows only the trailing portions of the anode voltage (A) or cathode voltage (C) pulse to effect the measurement of peak anode or cathode voltage. A maximum delay of 20 ms is herein provided. Trigger source selector switch 626 is used to select the various trigger sources available to the X-ray system calibrator here: external "EXT", automatic "AUTO", anode current ("MA"), peak anode (A), cathode (C) or anode plus cathode (A+C) voltage "KVP". In the external switch position, the system trigger is derived from an external source 288 (FIG. 2B). The "MA" position allows the system to trigger from the anode current (ma) signal. The "KVP" position allows the system to trigger from the X-ray tube electrode voltage signal which is selected with "ANODE A+C, CATHODE" control 611 prior to an exposure measurement. In the "AUTO" position the system automatically triggers under the control of the computing section 70 with a fixed rate, here of approximately one-half a second. The auto trigger position is useful, to enable a technician to ascertain the standby values of certain operating parameters of the X-ray system such as anode, cathode, line voltage and filament current.

"Procedure" switch 628 is used to select the operating mode of the X-ray system calibrator. The X-ray system calibrator has three operating modes. In the first mode, the procedure position "off" is used for normal data gathering operations of the X-ray calibrator that is, parameters are measured in response to an exposure initiated by the technician. In the second mode, the calibrator performs a test of its own analog and digital circuitry, i.e. that is, a self diagnostic program. The third mode, i.e. the coefficient of variation mode ("COEFF VAR"), the computing section 70 (FIG. 1) calculates a coefficient of variation of selected operating parameters for up to ten sets of stored operating parameters measured over ten corresponding exposure intervals and outputs the results to the corresponding displays. A coefficient of variation is here calculated for selected parameters such as anode current (ma), peak voltage (KV) and exposure quantity (MAS). The coefficient of variation is here given by:

$$CV = [1/\overline{X}] \ [(X_i - \overline{X})/(n-1)]^{\frac{1}{2}}$$

where:
CV = coefficient of variation
$\overline{X}$ = mean value of the displayed parameter
$X_i = i^{th}$ value of the displayed parameter
n = number of exposures in the sequence of exposures, here n=1 to 10

During the coefficient of variation mode the system delay potentiometer control knob 644 must be turned to the off position here fully counterclockwise, in order to obtain CV over ten full exposure intervals.

"Trigger mode" switch 630, is a two position switch used to select the type of trigger reference or threshold level signal fed to comparator 274 (FIG. 2B). When the trigger mode switch is used to select the percentage mode, the trigger reference level is calculated by the computing section 70 as a percentage of the measured selected trigger source signal occurring during the last previous exposure interval. When the trigger mode switch is used to select the preset mode, the trigger reference level is determined from the trigger reference level control 644, as an absolute value of the selected anode current or anode or cathode voltage trigger source signal or external trigger signal, as described above.

Trigger reference level knob 644, here a potentiometer allows the user to select the variable preset percent level or the preset trigger reference level prior to exposure. The trigger reference level signal is interpreted as a preset trigger reference level control or a percentage reference level control depending upon the state of the trigger mode switch 630. Trigger reference level 644 is used only when (A), (C), (A+C), (Ma) or external trigger sources are selected. The trigger reference level is coupled to the digitizing section 60 by coupling the trigger reference level line 57 through switch 246 of selector section 45 (FIG. 2B). The computing section 70 then computes a digital word representative of the value of the coupled trigger reference level signal When the digital word is to be read, it is read from the computing section 70 and is fed to D/A converter 272 for use by the triggering section 44.

"Manual trigger" knob 632, here a push button, when depressed will cause the calibrator to measure standby filament current ($I_f$), line voltage ($V_L$), X-ray tube voltage cathode current-sec. (MAS) and elapsed time for one exposure.

"Clear reading" knob 634, here a push button switch, when depressed will cause the computing section 70 to clear out the exposure data stored in memory 406 (FIG. 4) corresponding to the current exposure number and resets the exposure number count to that of the previous exposure. This switch is useful when making a series of exposures for replacing a set of erroneous data which occurred due to environmental noise. This allows for an otherwise competent set of data to be preserved and an additional reading to be obtained to replace the erroneous reading.

"Exposure recall" knob 636, here a push button switch when depressed will cause the computing section 70 to recall operating parameter for each of the previous nine or fewer exposures. Depressing this switch once allows the processor 70 to decrement the exposure number and display the previous exposure operating parameters in displays 604, 608 and 610. For example, this allows the X-ray technician to analyze the previous nine or fewer exposures, when a large variation is noticed in one or more of the operating parameters of the X-ray system. This will assist the X-ray technician in determining the cause of the variation in the operating parameter by aiding him in determining which component of the X-ray system including the tube is operating improperly. Further, depressing this switch does not alter the contents of the memory locations corresponding to the previously display of such operating parameters.

"Reset button" 638, when depressed causes the computing section 638 to clear such section 638 and re-initialize the system for the start of the next exposure sequence.

Power switch 642, when in the on position allows power to be supply X-ray to the system tester. When in the on position led light 640 will indicate that power is being supplied to the system.

Figure 7:
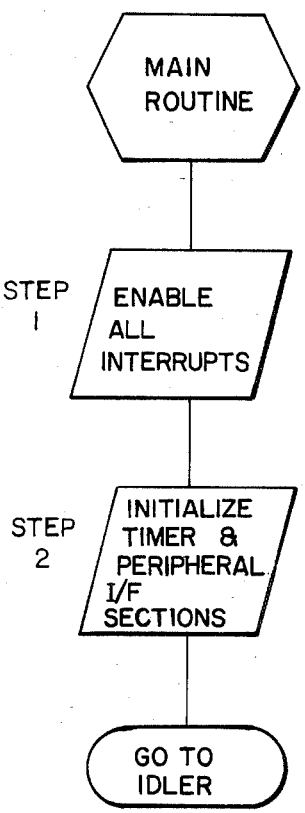

Now referring to FIGS. 7-16 flow charts which summarize a sequence of instruction stored in program store memory 404 (FIG. 4) are shown. Referring first to FIG. 7, the "main routine" for the X-ray system tester 10 includes as a first step, the enablement of interrupts which are generated by the digital counting section 62 on line 78d and by an end trigger pulse signal, start trigger pulse signal and start exposure indicator signal generated by the gating section 63 on lines 78a, 78b and 78c, additional interrupts may be generated by (manual trigger) button 632, (clear reading) button 634 and (exposure recall) button 636. In the second step of the "main routine", programmable timer 316 and peripheral interface section 420 are initialized with control and status information supplied from computer section 70 which configures timer section 316 and section 320 as previously explained. Upon completion of the "main routine" control is transferred to the idler routine shown in FIGS. 8A and 8B.

Figure 8A:
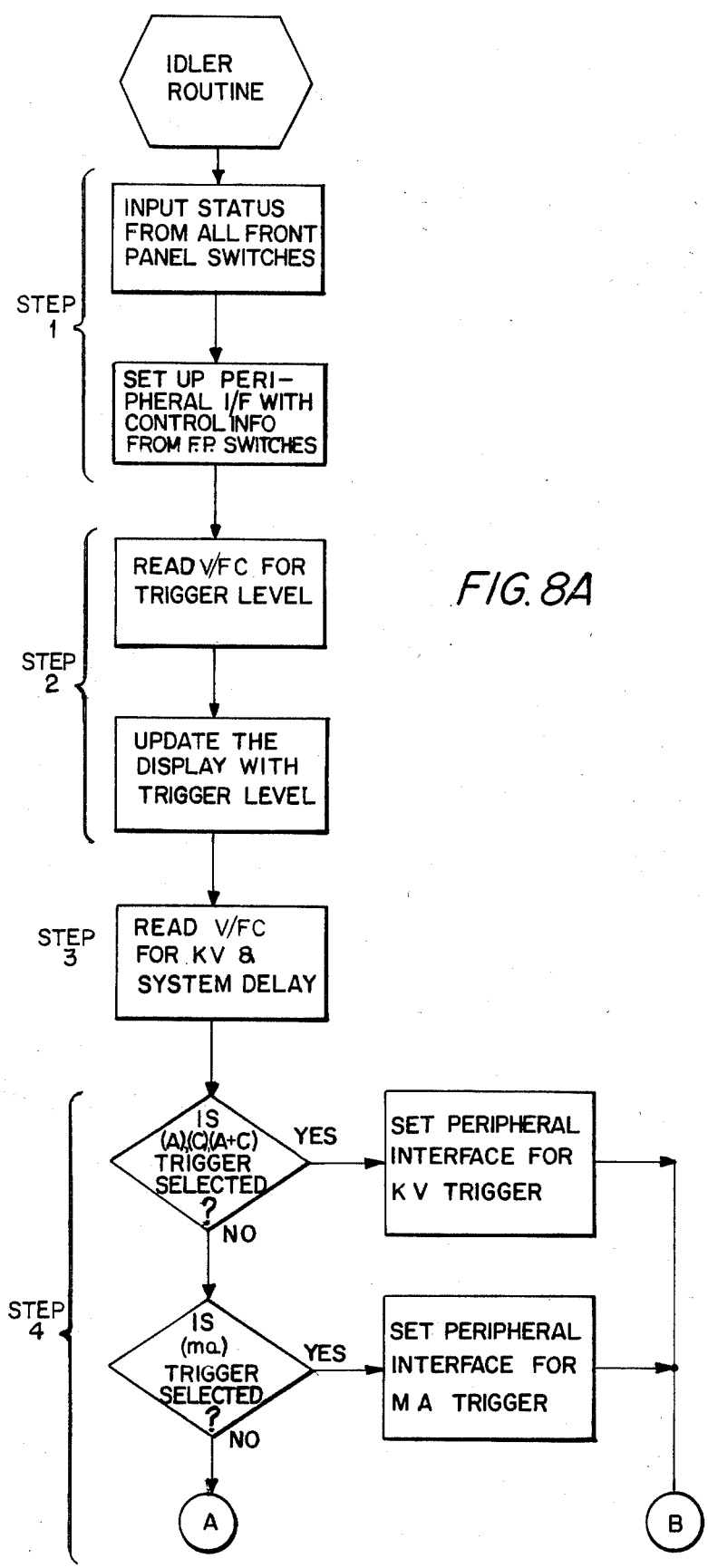
Figure 8B:
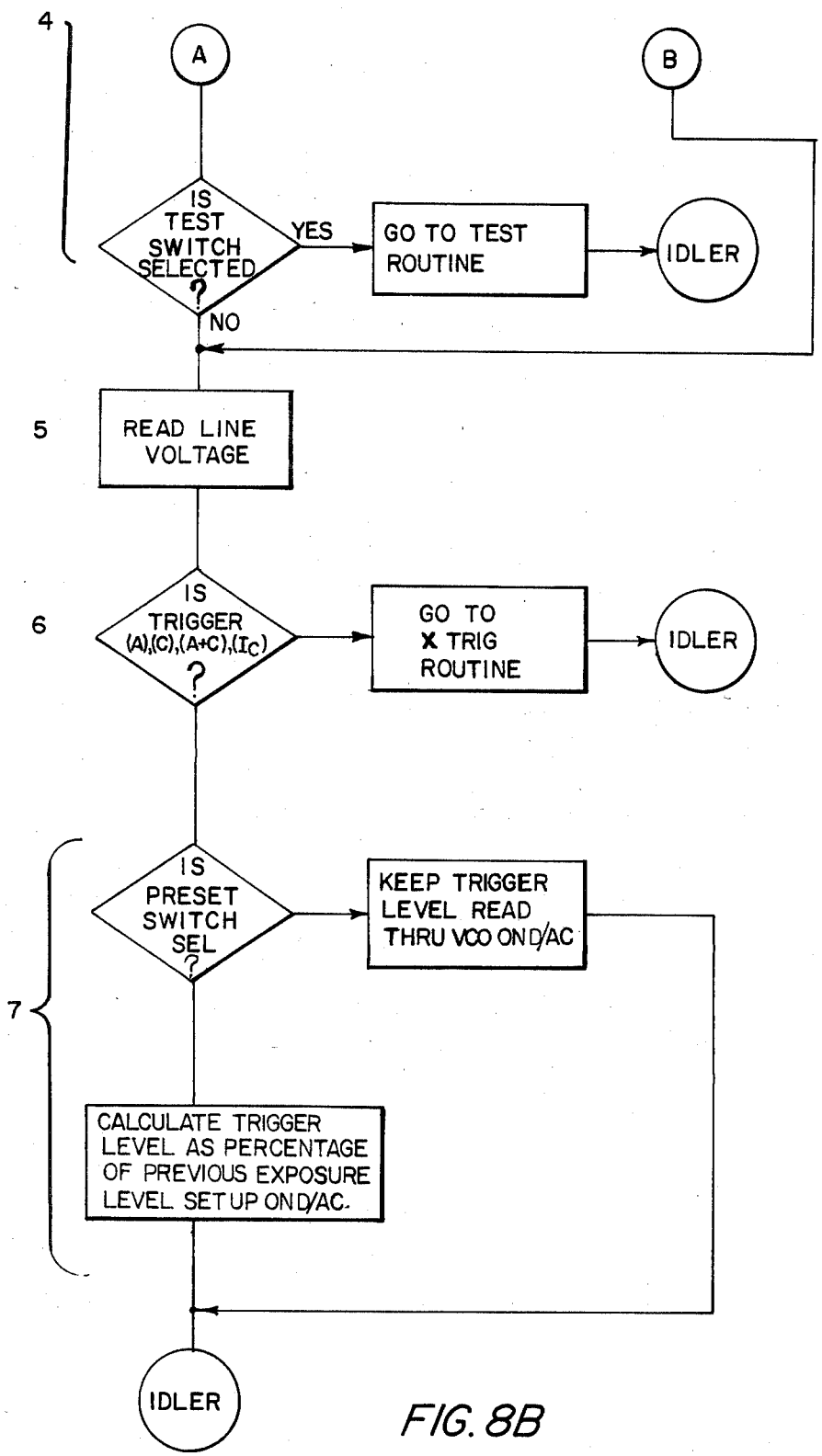

Referring now to FIG. 8A and FIG. 8B, the idler routine as a first step scans all the front panel switches including switch 611, switch 612, switch 614, switch 628 and switch 630. In accordance with the positions of the switches, control information is then inputted by the computing section 70 (FIG. 1) and used for further processing by the X-ray system tester. The control information as scanned from the switches 611, 612, 614, 628, 630 is processed and outputted to the peripheral interface section 420 to provide the necessary control information on calibrator control bus 72, to control the operation of the analog preprocessing section 40 (FIG. 1), digitizing section 60 (FIG. 2), and the computing section 70. For example, when the switch 611 is placed in the "anode" position, a control signal fed by control line 72a (FIG. 2A) couples the output of the amplifier 204 to the output of the selector 210. Thus, the anode voltage from the X-ray system 11 will be processed. If the "A+C" position of switch 611 is selected, control signals are fed by control lines 72a and 72b to couple anode voltage (A) from amplifier section 204 and cathode voltage (C) from amplifier section 216 to the output of selector 210. In this manner, the sum of anode plus cathode voltages (A+C) is processed, by the computing section 70. If the "cathode" position of switch 611 is selected, a control signal fed by line 72b will couple the output of amplifier 216 to the output of selector 210. Thus, cathode voltage will be processed by the computing section 70. Switch 612, when in the "MA" position, will cause the computing section 70 to output the value corresponding to anode current and to the display 608. Similarly, when the position of switch 612 is in the "MAS" position, the computing section 70 will output to the display 608 the value corresponding to the quantity MAS. In a similar manner when the switch 614 is in the "FILAMPS" position, a control signal fed by line 72d will couple the output of amplifier 244 to the output of switch 246. Thus, the filament current ($I_f$) will be processed by the computing section 70 and the value obtained for filament current ($I_f$) will be displayed in display 604. In a similar manner when switch 614 is in the "line N/L" position, a control signal on 72e will couple the input line 247 to the output of switch 246. In this manner, line voltage $V_L$ will be processed. Additionally, the computing section will go through a routine to process line voltage under a falling load condition by selecting switch position 614 in the "LINE N/L" position. In a similar manner when switch 614 is placed in the "LINE" position, line voltage will be processed by the computing section 70 and displayed in the display 604. When switch 626 in the "EXT" position, a control signal carried by control line $\overline{72k}$ will couple input line 288 to the output of selector 276 (FIG. 2B) thus enabling the external trigger source input to produce a trigger pulse at the output of comparator 274. When "trigger source" switch 626 is in the "auto" position, a trigger signal will be generated by the computing section 70 to periodically update standby values for the operating parameter the X-ray system as explained above. When "trigger source" switch 626 is in the MA position, control signals fed by control lines 72i and 72j will be decoded and selector 282 couples the input corresponding to anode current line 47 (FIG. 2A) to its output. A control signal fed by line 72k will cause selector 276 to be coupled to the output of selector 282 to provide a trigger source signal on the input of comparator 274. In a similar manner when "trigger source" switch 626 is placed in the "KVP" position, control signals 72i, 72j and 72k will couple ouptut line 231 (FIG. 2A) to the output of selector 276 to provide a trigger pulse from the output of comparator 274. Control signals provided by "procedure" switch 628 and "trigger mode" switch 630 are used by the computing section 70 during the operation of the X-ray system tester 10 to determine the mode of operation of the X-ray system tester 10 and the method by which a trigger reference signal is provided as previously explained above.

During step 2 of the "idler routine" a trigger reference level voltage from the trigger reference level potentiometer 644 on the front panel 80 is inputted to the computing section 70. This is accomplished by the computing section 70 producing control signals on lines 72f–72h. In response to such control signals selector 45 couples the trigger level signal on input line 57 to the output of the selector section 45. This output V/FC 61 voltage is then applied to the V/FC section 61 to generate a train of output pulses having a frequency proportional to the applied trigger level voltage. The frequency of the pulse train is determined by the counter section 62 and computing section 70 as described above. The trigger level voltage having been digitized and calculated by the computing section 70 is stored into the memory 406 of the computing section 70 and is displayed by display 618.

In step 3 the system in a like manner obtains KV delay and system delay parameters from dials 622, 624 on the front panel 80 through V/FC section 61 as was performed in the step 2 of the idler routine for trigger level signal.

In step 4 the sequence is used to determine which trigger source was selected from switch 626 is performed. If an X-ray pulse voltage trigger source "KVP" is selected the peripheral interface device 420 to enable signals on control lines 72i–72h to couple an X-ray tube voltage signal (i.e. anode voltage, cathode voltage or anode plus cathode voltage) to the comparator 274. If, on the other hand, the anode current trigger source "MA" is selected from the front panel the peripheral interface device 420 enables signals on control lines 72i–72h to couple anode current to the comparator 274. If the test switch was selected, the computing section 70 transfers control to a test routine used to self test the analog and digital sections of the X-ray tester system.

In step 5 the X-ray generator line voltage ($V_L$) is obtained in a manner as explained above for obtaining the trigger level voltage by coupling input line 53 (FIG. 2A) to the V/FC 61 FIG. 3) and counting the number of pulses in the pulse train from the V/FC 61 as explained above.

Step 6 of the idler routine is to determine whether a trigger source corresponding to tube voltage (A), (C) or (A+C) or anode current (ma) was selected. If neither an (ma), (A), (C) or (A+C) was selected an external trigger routine (XTRIG) is called. This routine will be discussed in conjunction with FIG. 9.

Step 7 of the idler routine is to determine which trigger mode has been selected from the trigger mode switch 630 (FIG. 6). If the preset position is selected, the trigger reference level read through the V/F converter section 61 is the actual trigger level to be applied to the D/A converter 272 and provide the threshold level signal for comparator 274 (FIG. 2B) in producing the trigger pulse. If the preset position of the trigger mode switch 630 (FIG. 6) is not selected then the computing section 70 calculates the threshold level signal and such calculated signal is fed by the computing section 70 to D/A converter 272. Here the threshold level is determined by the following calculation: The absolute value of the selected trigger source signal obtained during the last previous exposure is multiplied by a percentage factor derived by the computing section 70 from the trigger level voltage signal obtained from the front panel potentiometer 644. This is the end of the idler routine and control is transferred back to the beginning of the idler routine and the entire process is repeated. Control is removed from the idler routine only upon the occurrence of either of two events on an interrupt to be discussed in conjunction with FIGS. 10 through 16; or, system power turn-off.

Figure 9:
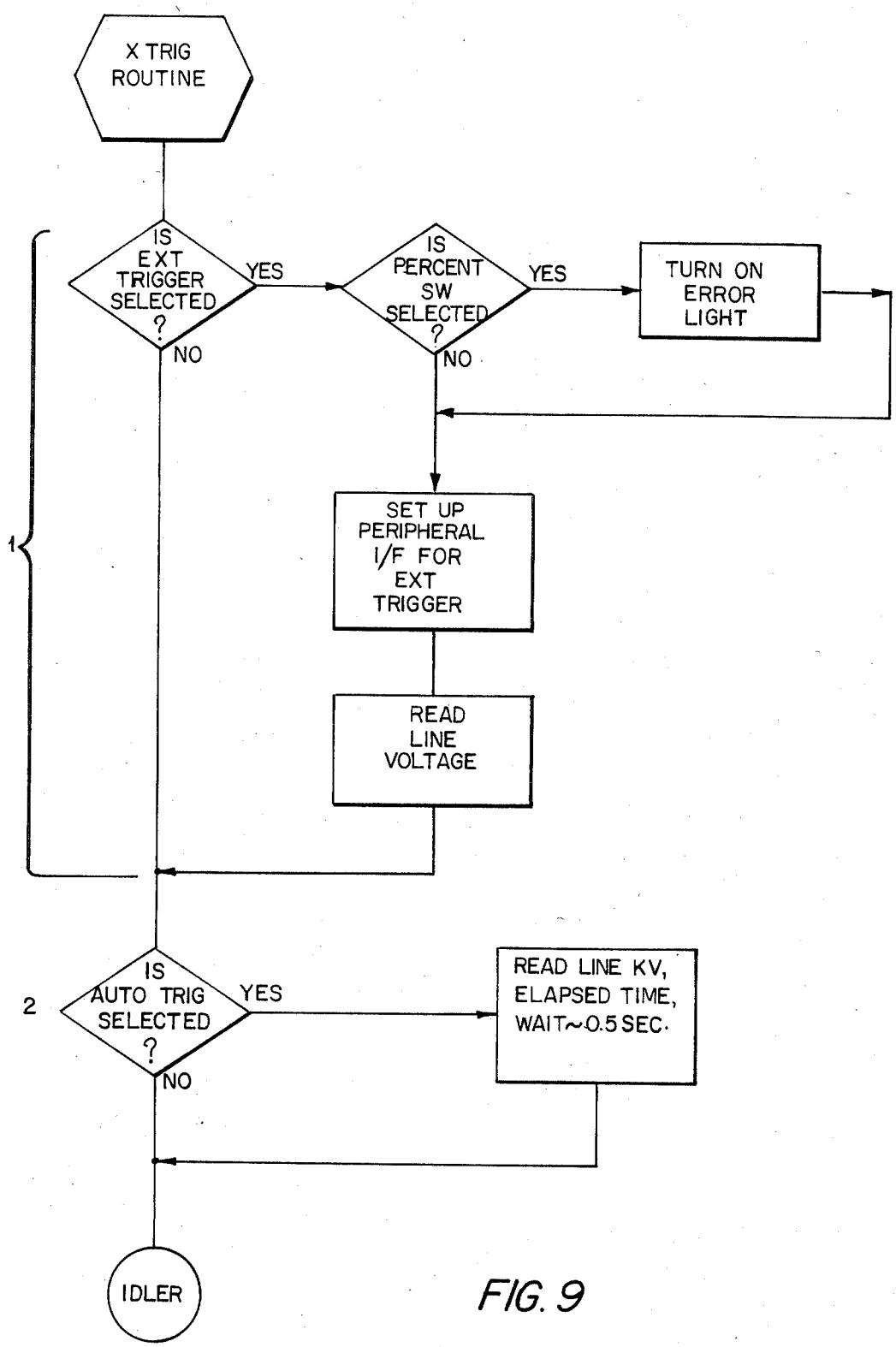

Now referring to FIG. 9, the flow chart for the external trigger routine (XTRIG) is shown. Step 1 in the external trigger routine is to determine whether the external trigger position of trigger source switch 626, was selected. If an external trigger was selected then it is determined whether the percent position of trigger mode switch 630 was selected. If the percent switch 630 was selected, the error light 616 is turned on. In either event, the peripheral interface device 420 is then set up for an external trigger because here the percent position of trigger mode switch 630 is not applicable for an external trigger signal. After the peripheral interface has been set up for an external trigger the line voltage ($V_L$) is read and control is transferred to the idler routine because the "auto trigger" has not been selected since auto trigger and external trigger modes are mutually exclusive.

In step 2, if the auto trigger mode was selected, the values of standby filament current ($I_F$), exposure time, peak anode voltage (A), peak cathode voltage (C) or peak anode plus cathode voltage (A+C), line voltage $V_L$ and milliamp current seconds (MAS) are obtained from the X-ray generating apparatus 11 and their values are computed by computing section 70 for display. The computing section 70 will wait approximately 0.5 seconds, before transferring control back to the idler routine. Thus in the auto mode the above parameters are updated at approximately 0.5 second intervals.

At this point, the computing section 70 has initialized the analog preprocessing section 40, digitizing section 60 and internal buffers in the computing section 70 (FIG. 1) to enable the start of an operational sequence of the X-ray system calibrator 10 by a technician in response to each X-ray exposure taken by such technician. When an activation signal (not shown) is sent to the X-ray system 11 by the technician to take an exposure, the X-ray tube is made operational and X-rays are emitted thereby. During this emission X-ray tube voltages and currents referred to above as operating parameters are supplied to the X-ray tester 10 via the high voltage unit 20 (FIG. 1). A series of trigger pulses is generated by trigger section 44 because of the alternating current nature of the X-ray operating parameters. These signals are applied to comparator 274 to generate corresponding trigger pulses on line 275 applied to comparator 274 (FIG. 2B) generated by the analog preprocessing section 40 from the X-ray system 11 (FIG. 1). The state of the trigger signal in then used to determine the sequence of operation of the computing section 70 in a manner now to be described. The trigger pulses generated on line 275 (FIG. 2B) produce end trigger pulse, start trigger pulse and start exposure indicator signals on lines 78a–78c respectively as described above. These signals on lines 78a–78c generate interrupts to the computing section 70. End trigger pulse and start trigger pulse signals on lines 78a–78b respectively generate an IRQINT interrupt. Start exposure indicator signal generates the NMI interrupt.

Figure 10:
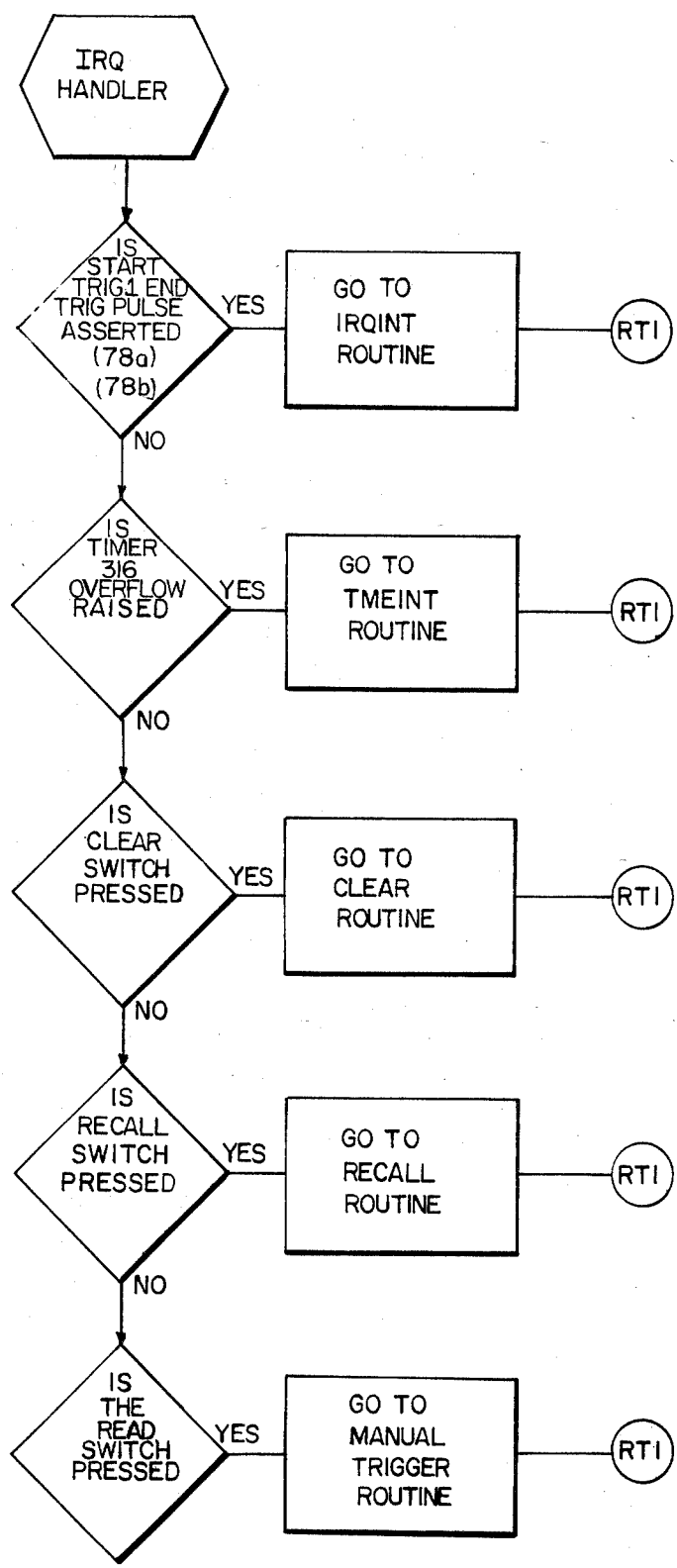

FIG. 10 shows a flow chart for an interrupt handler (IRQ HANDLER) routine. When an interrupt occurs in a manner to be described in connection with FIGS. 11–16B a corresponding routine for the interrupt is called by the computing section 70 to service the device causing the interrupt.

FIG. 11 is a flow chart which depicts the sequence of operations of the IRQINT interrupt routine. Step 1 of the IRQINT routine produces a signal sent to the peripheral interface section 420 which is then fed to the sample and hold section 250 via line 72l to place the sample and hold section 250 in a sample mode.

Step 2 of the routine is used to read the contents of timers 318a and 318b of timer section 316 into data memory 406. The initial contents of the timers 318a–318b are zero. This corresponds to reading the residual number of counts which occurred in the timers between TMEINT interrupts to be later described.

Step 3 is used to determine the state of the trigger pulse signal by examining the state of the "end trigger pulse" and "start trigger pulse" signals on lines 78a, 78b. If the trigger pulse signal is is present (i.e. "start trigger pulse" produced the interrupt) then the control signal on line 72l is asserted to enable sample and hold section 250 to hold on capacitor 252 the value of the selected voltage signal representative of ($I_F$) or ($V_L$) as previously explained. If the trigger signal is not present then the control signal on line 72l is not asserted. In either event step 4 of the routine is used to initialize the delay register included in the processor 400 (i.e. used for setting up system delay and KV delay features as described previously) and re-enable the computing section 70 for new "end trigger pulse" and "start trigger pulse" interrupts. Control is returned to the idler routine by execution of a return from interrupt instruction by computing section 70.

Referring now to FIG. 12, a flow chart for a TMEINT interrupt routine is shown. The TMEINT interrupt occurs when there is an overflow in the timer section line 316. The interrupt handler routine TMEINT keeps track of the number of the TMEINT interrupts which have occurred on line 78d, the particular one of the timers 318a–318b which caused the interrupt and stores the resulting number of TMEINT interrupts in a memory location of a computing section 70 corresponding to the one of the timers 318a–318b which causes the interrupt, as was previously explained. The programmable timer 316 is then enabled for a new interrupt. Control is then returned to the idler routine by execution of return interrupt instruction.

Now referring to FIG. 13, the flow chart for a CLEAR interrupt routine is shown. A CLEAR interrupt results from the clear switch 634 being pushed from the front panel. The interrupt handler routine "CLEAR" will decrement the current exposure number and alter all address pointers, pointing to memory locations in computing section 70 which correspond to the decremented exposure number data. Thus the next exposure will replace data in memory corresponding to the exposure number which was decremented in the locations pointed to by the altered address pointer. Control is then returned to idler routine through a return from interrupt instruction.

Now referring to FIG. 14, the flow chart for a RECALL interrupt routine is shown. A RECALL interrupt results from the recall 636 switch being pushed on the front panel. The RECALL routine decrements the current exposure number and displays the contents of the previous data set. The values of the sets of operating parameters corresponding to the current exposure number and the previous exposure number are not altered by this routine. This routine thus permits flexibility in analyzing the data obtained from the X-ray system, as was previously explained. The peripheral interface interrupt is then enabled and control is then returned to the idler routine through the execution of the return from interrupt instruction.

FIG. 15 shows the flow chart for a MANUAL interrupt routine. A MANUAL interrupt results from the MANUAL trigger switch 632 being pushed on the front panel. In step 1 of the "manual routine", the computing section 70 obtains readings for MAS and anode voltage (A) or cathode voltage (C) parameters as selected previously, resets the peak detector 226 (FIG. 2A) and obtains standby filament current or line voltage readings.

Step 2 of the "manual routine" ( the X-ray tube operating parameters obtained above) is used to calculate values for using a floating point arithmetic package. The display 84 is then updated by the computing section 70 with the new calculated operating parameter values. Control is then returned to the idler routine through a return from interrupt instruction. The "manual routine" in essence is a manual trigger routine, the values present (i.e. standby values) at the time the trigger is initiated are read by the X-ray system tester.

Figure 16A:
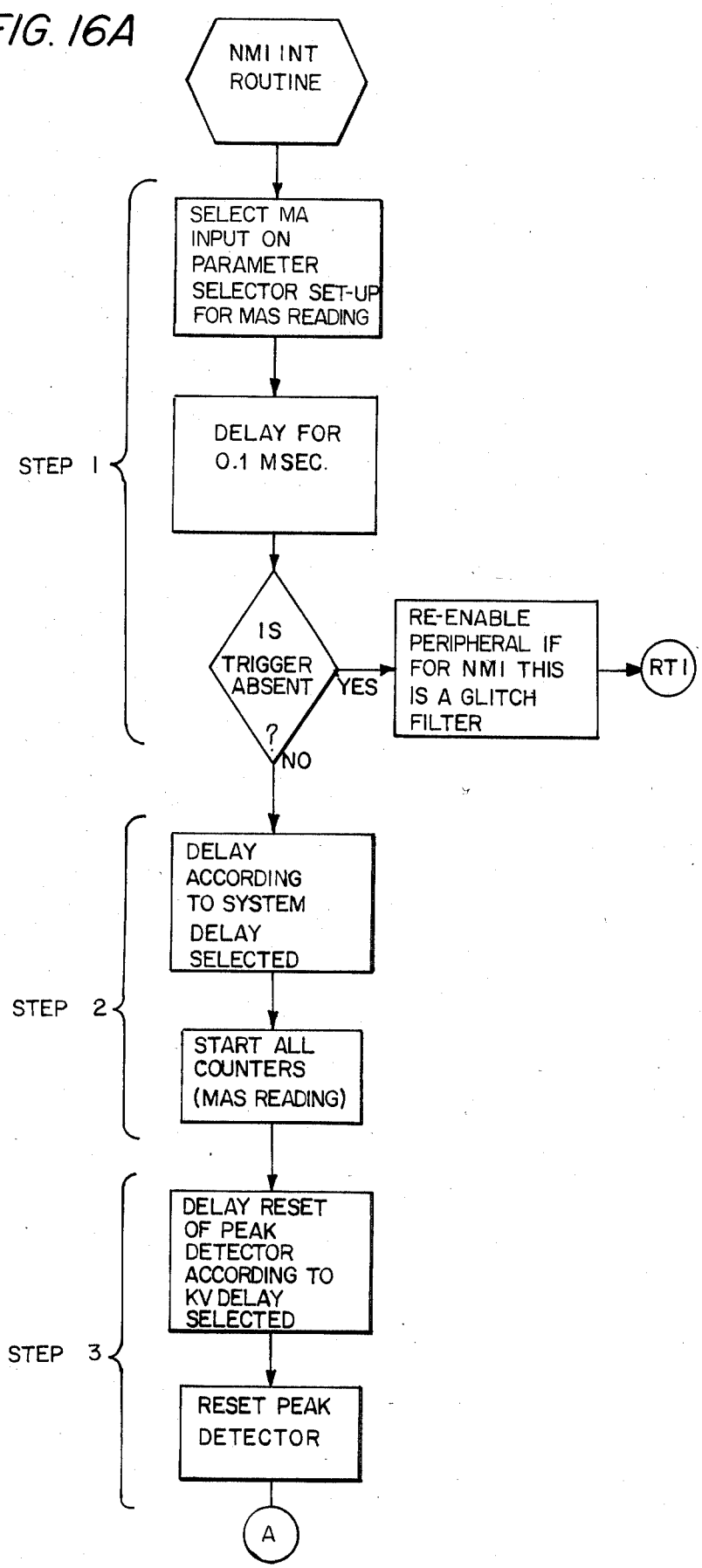
Figure 16B:
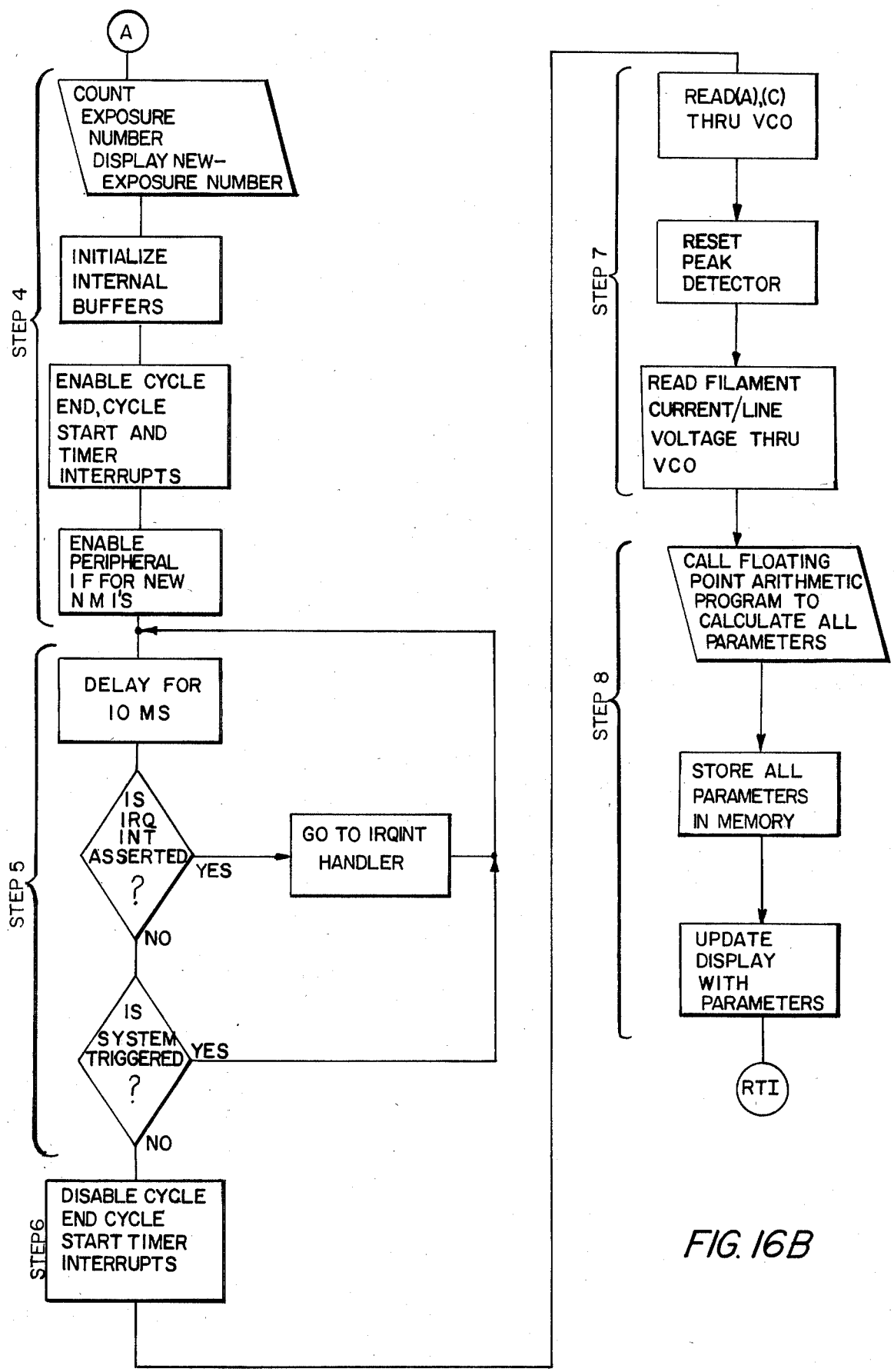

The FIG. 16 shows the nonmaskable interrupt routine "NMI". This interrupt routine occurs when the start exposure indicator signal is produced by gating section 63 (FIG. 3) as previously explained. In step 1 the computing section 70 sets for an anode current (ma) reading, then delays for here a 0.1 millisecond interval prior to determining the level of the trigger signal. The computing section 70 then determines the level of the trigger signal by examining the last value for end trigger pulse and stop trigger pulse. If the trigger signal is equal to a one as determined from examining the end trigger pulse signal, this indicates that a glitch occurred. The programmable peripheral interface section 420 is re-enabled and control is transferred back to the idler routine by execution of a return from interrupt instruction. This step corresponds to "glitch filter". If the trigger was determined to be equal to a zero, control is passed to the second step of the NMI routine.

In step 2, a delay loop is entered for a period equal to the corresponding system delay as determined in the idler routine. After this delay period has elapsed, the selector 45 (FIG. 1) is configured, to couple anode current (ma) (i.e. line 47) to the digitizing section 60 (FIG. 1). The digitizing section 60 converts the coupled signal proportional to anode current (ma) to a digitized count, and keeps track of the length of the exposure interval as explained previously. This information is supplied to the computing section 70 through the interrupts on lines 78a, 78b, 78d (FIG. 3) as explained above.

During this time, the quantity MAS is being measured in the timer 318a and exposure duration is measured on timer 318b.

In step 3, the computing section 70 delays for up to a twenty millisecond interval prior to resetting the peak detector capacitor 230. This variable delay, which corresponds to the KV delay feature indicated previously, is used to filter out all leading edge transients from the measurements of peak anode (A) or peak cathode (C) or peak anode plus cathode voltage (A+C).

In step 4, the exposure number is incremented and stored, all internal buffers are initialized, all maskable interrupts are enabled, and the peripheral interface is enabled for a new nonmaskable interrupt.

In step 5, the computing section 70 delays for a ten millisecond interval prior to testing the trigger signal. If an interrupt occurs while in this loop, control is transferred to the interrupt handler (FIG. 10). Without an interrupt occurring, the state of the trigger pulse signal is determined every ten milliseconds as explained above. If the trigger pulse signal after the end of any ten milliseconds interval is equal to a one, this indicates that the exposure interval is over and control is then transferred out of the loop and into a routine which calculates the measured system parameters. This step is particularly useful to automatically adapt the X-ray tester 10 to measure operating parameters of both single phase or multiphase (i.e. three phase) systems. Since single phase systems produce signals which are multiples of 8.33 milliseconds, this step permits the X-ray tester 10 to distinguish between the next trigger signal and the start of a new exposure for a single phase system. In step 6, the computing section 70 disables the peripheral interface section 420 (FIG. 4) for new end trigger and start trigger pulse interrupts. In step 7 the computing section 70 enables the signals corresponding to parameters such as peak anode or peak cathode or peak anode plus cathode voltages, filament current or line voltage to selectively couple through the selector 45 (FIG. 1) to the voltage to frequency converter section 61. In step 8 the values of these parameters as explained above are calculated using the floating point arithmetic package. The values for parameters mA, MaS, (A) or (C) or (A+C), line voltage ($V_L$) or filament current ($I_f$) are outputted to display 84 by the computing section 70. Control is then returned to the idler routine by the execution of a return from interrupt instruction.

Having described a preferred embodiment of the invention it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. Apparatus for measuring a plurality of operating voltages and currents of an X-ray system comprising:
   means for providing a first plurality of output analog signals, each one being representative of a corresponding one of the plurality of operating voltages and currents of the X-ray system;
   means for producing a second plurality of output analog signals, each one corresponding to an operator selected signal;
   means responsive to a control signal for coupling one of the first plurality of output analog signals and the second plurality of output analog signals to an output thereof selectively in accordance with the control signal;

a voltage to frequency converter coupled to the output of the selector means to convert the selected one of the input analog signals into a train of pulses having a frequency proportional to the value of the selected parameter; and means, fed by the train of pulses for calculating the value of the selected one of the operating parameters and operator selected processing signals in response to the frequency of the pulse train.

2. Apparatus for measuring operating voltages and currents of an X-ray system comprising:

means for sensing signals corresponding to the operating voltages and current signals of the X-ray system;

means for producing a plurality of operator selectable analog processing signals;

means, responsive to a pair of control signals, for coupling one of the signals corresponding to the operating voltages and currents to an output of the coupling means in response to a first one of the pair of control signals and for coupling one of the plurality of operator selectable analog processing signals to the output of the coupling means in response to a second one of the pair of control signals;

means coupled to the output of the coupling means for converting the signal produced at the output of the coupling means into a corresponding digital signal;

control means, for producing during an initialization mode, the second one of the pair of control signals and for producing, during an operating mode, the first one of the pair of control signals; and wherein a first one of said operator selectable analog signals corresponding to a predetermined time interval, and wherein in response to the start of an operational interval of the X-ray system, said control means provides said first control signal after the predetermined time interval.

3. The apparatus of claim 2 further comprising:

(a) means for storing a plurality of sets of data, each set of data representing the processed value of said operating voltages and currents produced by the X-ray system in response to the operation of the X-ray system; and (b) means for recalling a selected one of the stored plurality of sets of data.

4. The apparatus as recited in claim 2 wherein one of said operating voltages and currents of the X-ray system is a first one of peak anode and peak cathode voltage signals and wherein said first one of said operator selectable analog signals corresponding to a predetermined time interval is fed to said computing means to provide a control signal after a predetermined time interval corresponding to the value of said operator selected control signal to provide a peak value of the selected one of peak anode and peak cathode voltage corresponding to the peak value of such selected voltage signal after the predetermined time interval.

5. The apparatus as recited in claim 2 wherein one of said operator selectable control signals corresponds to a first selectable time interval and wherein in response to the initiation of an exposure interval of the X-ray system, said control means provides each one of the control signals after a predetermined time interval corresponding to the value of said parameter control signal 6. The apparatus as recited in claim 5 wherein said control means provides control signals to measure each one of said first plurality of output analog output signals over a second, different predetermined time interval, said interval being less than the time duration of the exposure interval of the X-ray system.

7. A method for measuring operating parameters of an X-ray system in accordance with operator selected signals comprising the steps of:

feeding analog signals representative of the plurality of operating parameters and operator selected signals to a multiplexer;

converting each one of said analog signals into a digital signal further comprising the steps of:

selecting one of said analog signals by feeding a control signal to said multiplexer to select the analog signal;

converting the selected analog signal to a pulse train having a frequency related to a value of the selected analog signal;

counting the number of pulses in the pulse train during a predetermined time interval;

calculating the value for the selected signal by dividing the number of pulses in the pulse train by the predetermined time interval.

8. The method as recited in claim 7 wherein one of said operator signals is a system delay signal and wherein said method further comprises the step of delaying a predetermined amount of time prior to counting the number of pulses occurring in the pulse train in accordance with the value of said system delay signal.

9. The method as recited in claim 7 further comprising the steps of:

operating the X-ray system, a plurality of times;

storing a plurality of sets of data, each set of data representing the calculated value of operating parameters produced by the X-ray system in the response to the operation of the X-ray system; and recalling a selected one of the stored plurality of sets of data.

10. A testing apparatus for measuring the operating voltages and currents of an X-ray system having an X-ray tube including anode, cathode and filament electrodes, a high voltage supply source coupled to the anode and cathode electrodes, and a filament supply source coupled to the filament electrode comprising:

computing means for executing a set of instructions and for providing in accordance with such executed instructions a plurality of control signals;

anode current sensing means, fed by a first signal proportional to anode current produced by the X-ray tube during an exposure interval, for producing a first analog output signal representative of analog current during operation of the X-ray system;

anode and cathode voltage sensing means, fed by a second signal proportional to the anode voltage and a third signal proportional to cathode voltage of the X-ray tube for producing a second analog output signal representative of the peak value of a selected one of the anode voltage and cathode voltage signals;

line voltage and filament current sensing means, fed by a fourth signal proportional to filament current and a fifth signal proportional to the value of an input line voltage fed to the high voltage supply source for producing a third analog output signal representative of the steady state value of a selected one of line voltage and filament current signals;

means, fed by such first, second and third analog output signals, for selectively coupling one of such analog output signals to an output thereof, in accordance with control signals provided by the computing means;

voltage to frequency converter means coupled to the output of the selector means for producing a train of pulses having a frequency proportional to the amplitude of the selected analog signal coupled to the output of the selector means;

pulse counting means for counting the number of pulses the train of pulses and for providing the number of said pulses to the computing means;

means for providing to the computing means a signal indicative of the start of an exposure interval of the X-ray system and for initiating the sequence of instructions to provide the control signals; and wherein the computing means is fed the number of counts in the pulse train over the predetermined time interval, calculates a value corresponding to the value of the selected one of such operating voltages and current of the X-ray system, stores such calculated value in the memory, and provides a second, different set of control signals for selecting a second, different one of said analog output signals.

11. An apparatus for measuring the operating voltages and currents of an X-ray system having an X-ray tube including anode, cathode and filament electrodes, a high voltage supply source coupled to the anode and cathode electrodes, and a filament supply source coupled to the filament electrode comprising:

computing means for executing a set of instructions stored in a memory and for providing in accordance with such executed instructions a plurality of control signals;

first means for providing a first plurality of output analog voltage signals comprising:

anode current sensing means, fed by a signal proportional to anode current, for producing a first one of such first plurality of output analog voltage signals representative of analog current during operation of the X-ray system;

anode, cathode voltage sensing means, fed by a signal proportional to anode voltage and a signal proportional to cathode voltage, for selecting in accordance with a control signal provided from the computing means, one of such anode voltage and cathode voltage signals, said means further including a peak detector fed by the selected one of such signals for producing a second one of such plurality of output analog voltage signals representative of the peak value of the selected one of anode voltage and cathode voltage signals, said peak detector being fed a control signal from the computing means to reset the peak detector prior to a measurement interval;

line voltage and filament current sensing means, fed by a signal proportional to filament current and a signal proportional to an input line voltage signal provided to the high voltage supply source, for selecting in accordance with a second pair of such signals provided from the computing means, one of such line voltage and filament current signals, and for producing a third one of such plurality of output analog voltage signals representative of the steady state value of the selected signal;

second means for producing a second plurality of analog output voltage signals proportional to operator selectable control signals;

selector means fed by such first and second plurality of analog output voltage signals for coupling one of such analog output signals to an output of such second means selectively in accordance with control signals provided by the computing means;

converter means coupled to the output of the selector means for converting the selected analog output voltage signal into a digitized representation of such signal which is fed to the computing means and stored in a memory; and triggering means, for producing a signal indicative of the start of an exposure of the X-ray system.

12. The apparatus es recited in claim 11 wherein one of said operator selectable control signals corresponds to a predetermined time interval, and wherein in response to the initiation of an exposure sequence, said computing means provides a peak detector reset control signal to the peak detector after a time interval corresponding to the value of said operator selectable control signal to provide a peak value of the selected one of peak anode and peak cathode voltage corresponding to the peak value of the selected voltage after the predetermined time interval.

13. The apparatus as recited in claim 11 wherein one of said operator selectable control signals corresponds to a first selectable time interval, and wherein in response to the initiation of an exposure sequence, said computing means provides each one of the control signals after a time interval corresponding to the value of said parameter control signal.

14. The apparatus as recited in claim 13 wherein said computing means provides control signals to measure each one of said first plurality of output analog voltage signals over a second, predetermined time interval, said interval being less than the time duration of an exposure interval of the X-ray system.

* * * * *